United States Patent
Ogle et al.

(10) Patent No.: US 11,482,295 B2
(45) Date of Patent: Oct. 25, 2022

(54) TESTING MAGNETORESISTIVE RANDOM ACCESS MEMORY FOR LOW LIKELIHOOD FAILURE

(71) Applicant: Infinitum Solutions, Inc., Santa Clara, CA (US)

(72) Inventors: Wade Ogle, San Jose, CA (US); Henry Patland, Los Gatos, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 54 days.

(21) Appl. No.: 17/033,586

(22) Filed: Sep. 25, 2020

(65) Prior Publication Data

US 2022/0101937 A1    Mar. 31, 2022

(51) Int. Cl.
| | | |
|---|---|---|
| *G11C 29/38* | (2006.01) | |
| *G11C 29/44* | (2006.01) | |
| *G11C 11/16* | (2006.01) | |

(52) U.S. Cl.
CPC .......... *G11C 29/38* (2013.01); *G11C 11/1673* (2013.01); *G11C 11/1675* (2013.01); *G11C 29/44* (2013.01)

(58) Field of Classification Search
None
See application file for complete search history.

(56) References Cited

U.S. PATENT DOCUMENTS

| | | | | |
|---|---|---|---|---|
| 10,424,372 B1* | 9/2019 | Sforzin | .............. | G11C 13/0004 |
| 2013/0294144 A1* | 11/2013 | Wang | .............. | G11C 29/50008 |
| | | | | 365/148 |
| 2019/0006022 A1* | 1/2019 | Niu | ...................... | G11C 29/028 |

FOREIGN PATENT DOCUMENTS

| | | | | |
|---|---|---|---|---|
| EP | 1132924 A2 * | 9/2001 | ............. | G11C 29/02 |
| WO | WO-2021118634 A1 * | 6/2021 | | |
| WO | WO-2021118658 A1 * | 6/2021 | | |

OTHER PUBLICATIONS

M. Hosomi et al., "A novel nonvolatile memory with spin torque transfer magnetization switching: spin-ram," IEEE InternationalElectron Devices Meeting, 2005. IEDM Technical Digest., 2005, pp. 459-462, doi: 10.1109/IEDM.2005.1609379.

WLA-2000 STT-MRAM Wafer Level Analyzer Brochure, Infinitum Solutions, Inc., Dec. 13, 2013.

* cited by examiner

*Primary Examiner* — Guerrier Merant

(74) *Attorney, Agent, or Firm* — Paradice & Li LLP

(57) ABSTRACT

A Magnetoresistive Random Access Memory (MRAM) device is tested using a high repetition test that detects one or more low-likelihood failures, such as a failure to properly switch between a high or low resistive state. A series of write and read operations are performed for a large number of test cycles at high frequency. A first tier measurement is used to determine if a switching failure occurred, e.g. by comparing the read signal to target level(s) after each operation. When a switching failure event is detected, a second tier measurement is used to measure and store switching performance parameters, for example, the value of the read signal, while the MRAM device is in a failure state. The high frequency testing may be paused during the second tier measurements. Additional performance parameters may be measured during the second tier measurements.

62 Claims, 9 Drawing Sheets

TESTING MAGNETORESISTIVE RANDOM ACCESS MEMORY FOR LOW LIKELIHOOD FAILURE

BACKGROUND

Magnetoresistive random access memory (MRAM) devices store data in magnetic domains. MRAM cells may be formed with two ferromagnetic plates that are separated by a thin insulating layer. The electrical resistance in a MRAM cell changes with the relative orientation of the magnetization in the two plates. One of the plates may be a permanent magnet and the other plate's magnetization may be changed to store a bit of data in a configuration known as magnetic tunnel junction (MTJ). A memory device may be formed from a grid of such "cells".

Application of a relatively high positive (or negative) voltage pulse with a specific pulse width and amplitude will cause an MRAM device, such as a MTJ cell, to toggle from low to high resistance (or high to low) state, which is conventionally known as writing. The state of the MRAM device may be read by applying a suitably low bias voltage to read the resistance.

During or after manufacturing of MRAM devices it is, of course, important to test the devices to ensure proper operation, as well as to ensure that the manufacturing process is within tolerances. For example, one type of test that may be employed is error rate testing, which determines whether an MRAM device correctly switched from high to low or low to high after a writing function. MRAM devices, however, are typically highly reliable and, accordingly, a failure is a low-likelihood event. Error rate testing accordingly requires many write and read cycles to detect a failure event, which can be time consuming. Improvements for testing MRAM devices are desirable.

SUMMARY

A Magnetoresistive Random Access Memory (MRAM) device may be tested using a high repetition, high frequency test, capable of detecting one or more low-likelihood failures, such as a failure to properly switch between a high or low resistive state. A series of write and read operations may be performed over a large number of test cycles at high frequency. A first tier measurement is used to determine if a switching failure occurred, e.g., if the MRAM device failed to properly switch resistance states or switched resistance states when it was not intended. For example, the read signal may be compared to one or more target levels after each operation to determine if a switching failure occurred. One or more analog comparators may be used, for example, to enable high frequency test cycles for the first tier measurement. When a switching failure event is detected, a second tier measurement is used to measure and store switching performance parameters, such as the value of the read signal, which may be a current value, a voltage value, or a resistance value, while the MRAM device is in a failure state. The high frequency test cycles, for example, may be paused in order to perform or complete the second tier measurement, e.g., measuring and recording the read resistance after a failure event. Additional tests may be performed and additional performance parameters may be measured during the second tier measurements, e.g., while the test cycles are paused and the MRAM device is in a failure state.

In one implementation, a method of testing a Magnetoresistive Random Access Memory (MRAM) device may be performed. The method may include performing a plurality of test cycles on the MRAM device at a first frequency, wherein each test cycle comprises a write operation and a read operation applied to the MRAM device that produces a read signal from the MRAM device. The method may further include performing a first tier of measurement to determine whether a switching failure occurs in the MRAM device at each test cycle by comparing the read signal from the MRAM device to a target level. The method may further include performing a second tier of measurement on the MRAM device comprising measuring one or more switching performance parameters of the MRAM device while the MRAM device is in a failure state. The method may include recording the one or more switching performance parameters of the MRAM device for each occurrence of the switching failure.

In one implementation, an apparatus for testing a Magnetoresistive Random Access Memory (MRAM) device may include a probe array configured to be coupled to the MRAM device to provide a write pulse and a read bias and receive a read signal; one or more measurement circuits that provide measurements of the read signal; at least one memory; and at least one processor coupled to the probe array, the one or more measurement circuits, and the at least one memory. The at least one processor may be configured to perform a plurality of test cycles on the MRAM device at a first frequency, wherein each test cycle comprises a write operation and a read operation applied to the MRAM device that produces the read signal from the MRAM device. The at least one processor may be further configured to perform a first tier of measurement on the MRAM with the one or more measurement circuits to determine whether a switching failure occurs in the MRAM device at each test cycle by comparing the read signal from the MRAM device to a target level. The at least one processor may be further configured to perform a second tier of measurement on the MRAM device with the one or more measurement circuits to measure one or more switching performance parameters of the MRAM device while in the MRAM device is in a failure state. The one or more switching performance parameters of the MRAM device are recorded for each occurrence of the switching failure.

In one implementation, an apparatus for testing a Magnetoresistive Random Access Memory (MRAM) device may be performed. The apparatus may include means for performing a plurality of test cycles on the MRAM device at a first frequency, wherein each test cycle comprises a write operation and a read operation applied to the MRAM device that produces a read signal from the MRAM device. The apparatus may include a means for means for performing a first tier of measurement to determine whether a switching failure occurs in the MRAM device at each test cycle by comparing the read signal from the MRAM device to a target level. The apparatus further includes a means for means for performing a second tier of measurement on the MRAM device comprising measuring one or more switching performance parameters of the MRAM device while in the MRAM device is in a failure state. The apparatus further includes a means for recording the one or more switching performance parameters of the MRAM device for each occurrence of the switching failure.

DETAILED DESCRIPTION

A Magnetoresistive Random Access Memory (MRAM) device may be tested using a high repetition, high frequency test. The test detects a low-likelihood failure in the MRAM device, and accordingly, many repetitions at high frequency are used to detect such failures in a commercially practical manner. In order to perform the test at a suitably high frequency for commercial practicality, it may not be possible to precisely measure the value of the read signal from the MRAM device after each operation. Accordingly, a two tier testing system is used, in which a first measurement tier is used to perform a coarse measurement that quickly determines whether a switching failure occurred, and a second measurement tier is used to perform a more refined measurements only if a switching failure is detected in the first measurement tier. For example, the first measurement may be performed by a comparator circuit that can quickly determine whether the value from the read signal exceeds a threshold to determine whether a failure in switching resistance states in the MRAM occurred. With use of a comparator, such as an analog comparator for example, the first measurement tier may be performed at very high frequency. When a failure is detected, the second measurement tier is used to measure and record switching performance parameters of the MRAM device. The second measurement tier may be slower than the first measurement tier, and accordingly, the testing may be momentarily paused while the switching performance parameters, such as a precise read resistance of the MRAM device, are measured and recorded. While the testing is paused, additional testing may be performed for the second measurement tier, while the MRAM device is in a failure state.

Figure 1:
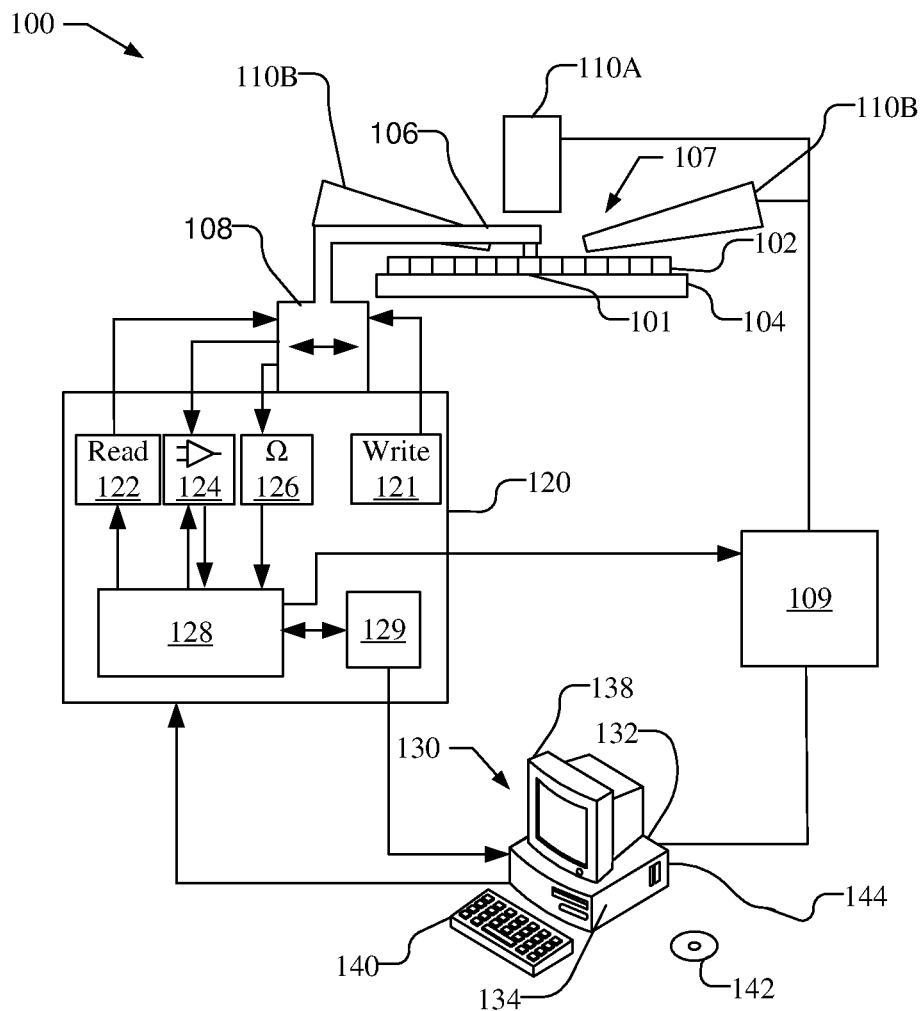
FIG. 1 is a block diagram of a testing device that may be used for testing magnetic-based Random Access Memory (MRAM) devices.

FIG. 1 is a block diagram of a testing device 100 that may be used for testing magnetic-based Random Access Memory devices, such as magnetoresistive RAM (MRAM), including magnetic tunnel junction (MTJ) devices, spin-transfer torque (STT-MRAM) devices, spin-orbit torque (SOT-MRAM) devices, Toggle MRAM, etc., referred to herein as MRAM devices. The MRAM device 101 under test, which may be on a wafer 102, in chip form, or in any other desired form, is held with a mounting block 104 while electrical connections are made with a probe card 106. The probe card 106 may be held with a base 108, that may move the contact elements of the probe card 106 to make contact with any desired MRAM device 101 on the wafer 102. Commonly, the probe card 106 will be fixed, and the wafer 102 will be positioned from device to device with respect to the probe card 106 by a physically repositioning plate coupled to the mounting block 104. If desired, the probe card 106 may include contact elements to contact a plurality of MRAM devices 101 in the wafer 102 (or chip) simultaneously, and to process multiple MRAM devices 101 the testing device 100 may include a multiplexer connection to the plurality of contact elements on the probe card, or the testing device 100 may have parallel testing channels.

The probe card 106 includes electrical connections for writing to and reading from the MRAM device 101. The number of electrical connections provided by the probe card 106 may be dependent on the type of MRAM device 101 to be tested. STT-MRAM has 2 pin connections and writing/reading is applied via the same connections, and SOT-MRAM has 3 or 4 with a separate writer and reader (e.g., the 3 or 4 pins being dependent on whether ground (GND) is commonly shared between the writer and reader). For example, for an STT-MRAM, the probe card 106 may provide two electrical connections, one connection for both writing and reading, and another connection to the ground side of the MRAM device. For an SOT-MRAM, by way of example, the probe card may have three or four electrical connections, e.g., with a first connection for writing, a second connection for reading, and the third connection for ground (a fourth connection may be used if ground is not commonly shared by the write and reader.

Additionally, if desired, the testing device 100 may include a magnetic field generator 110 that includes one or more electromagnetic poles 110A and/or 110B, which may be used to apply one or more external magnetic fields to the MRAM device 101 during testing. To generate an incidental (perpendicular) field to the MRAM device 101, a combination of an upper pole 110A with return poles 110B may be used, e.g., with the upper pole 110A generating a projected magnetic field that is orthogonal to the MRAM device 101, and then beneath the MRAM device 101 the lines of the magnetic field loop around and return to the return poles 110B. An in-plane magnetic field may be produced by powering off, or removing upper pole 110A, and generating a magnetic field between poles 110B. The projected field lines will arc between poles 110B but will be essentially horizontal (in-plane) at the center point of the two poles 110B where the MRAM device 101 is located. The electromagnetic poles 110A or 110B may be coils around one or more cores or in some implementations, may be Helmholtz coils, that may produce magnetic fields of varying magnitude and polarity. As illustrated in FIG. 1, the electromagnetic pole 110A may be used to produce a magnetic field that is in plane with the MRAM device 101, while electromagnetic pole 110B is used to produce a magnetic field that is normally incident with respect to the MRAM device 101. The magnetic field generator 110 includes the electromagnetic pole 110A and/or 110B and connected to a power supply 109 to provide the excitation current to the electromagnetic coils.

The probe card 106 and the magnetic field generator 110 may be electrically coupled to a switching detection circuit 120. For example, the switching detection circuit 120 may be coupled to provide write signals and receive read signals to and from the MRAM device 101 via the probe card 106. The switching detection circuit 120 may be further connected to a power supply 109 for the magnetic field generator 110 (if used) and may control the magnetic field generator 110, via the power supply 109, to turn on or off a magnetic field and to vary the magnetic field as desired, which may continuously change or incrementally change. Moreover, the parameters of the magnetic field, for example, the magnitude and the cycle length, may be controlled as desired.

The switching detection circuit 120 includes a write pulse generator 121, which for the sake of simplicity will be discussed herein generally as a voltage generator, but may be equivalently a current generator. The write pulse generator 121 may generate a write pulse in the form of positive and negative voltage pulses having controllable parameters, such as pulse width and amplitude, that may be applied to the MRAM device 101 via the probe card 106 to write to the MRAM device 101. A read bias generator 122 may generate a read bias signal that may be applied to the MRAM device 101 via the probe card 106 to produce a read signal from the MRAM device 101. The read bias generator 122, for example, for the sake of simplicity will be discussed herein generally as a voltage generator, but may be equivalently a current generator. The read bias generator 122 may produce a read bias voltage with a controllable magnitude. In some implementations, the write pulse generator 121 and the read bias generator 122 may be separate devices. In other implementations, the write pulse generator 121 and the read bias generator 122 may be combined into a single device, i.e., read bias generator 122 may be used for both write pulse generation and read bias generation. The read bias signal from the read bias generator 122 may be used for generating a read signal from the MRAM device 101, which may be connected to a switching detection circuitry for two tier measurement, including a relatively fast failure state detector and a relatively slower resistance measurement, as discussed herein.

The two tier measurement probe card 106, base 108, or the switching detection circuit 120 may include either a current sense circuit and/or a voltage sense circuit that may be used for the two tier measurement. For example, for current sensing, a sense resistor may be placed somewhere within the circuit pathway. For voltage sensing, a set of high-impedance connections that may be coupled to the MRAM device 101 connections, e.g., close to the MRAM device 101 in order to eliminate connection resistance. The current sensing mode may be used with voltage biasing, i.e., when read bias generator 122 produces a voltage bias signal, and the voltage sensing mode may be used with current biasing i.e., when read bias generator 122 produces a current bias signal. Thus, it should be understood that although the read bias voltage and read signal are sometimes described herein as being generated using a voltage bias and current sensing circuit, other circuit designs known in the art for producing a read signal may be utilized, for example, a current bias and voltage sensing circuit. Further, as an example, the read signal created for fast measurements, e.g., for first tier measurements by the switching detection circuit 120 may use voltage bias and current sensing circuitry, while the read signal for resistance measurement, e.g., for the second tier measurements, may use current bias, voltage sensing circuitry, or vice versa.

The switching detection circuit 120 may be configured to perform first tier measurements quickly to determine whether the MRAM device 101 is in a failure state, and second tier measurements to precisely measure one or more switching characteristics of the MRAM device 101, e.g., the precise value of the read signal, after the MRAM device 101 is determined to be in a switching failure state by the first tier measurements. For example, as illustrated in FIG. 1, the switching detection circuit 120 may include a fast high/low qualifier 124, which may perform the first tier measurements, and a precise resistance meter 126, which may perform the second tier measurements. The resistance meter 126, for example, may be an analog to digital converter (ADC), which converts the value of the analog read signal to a digital value, which may then be stored in memory. It should be understood that the value of the analog read signal may be a current value or a voltage value, which are proportional to the resistance of the MRAM device, or may be a measured resistance value and, accordingly, an ADC that converts the read signal to a digital signal is referred to herein as a resistance meter 126. Unlike the resistance meter 126, which measures the resistance value of the read signal from the MRAM device 101, the qualifier 124 does not measure the resistance value for the first tier measurements. The qualifier 124 compares the read signal to one or more thresholds to quickly determine whether the resistance is less than or more than the one or more thresholds, from which a coarse resistance for the read signal may be determined, from which the switching detection circuit 120 may determine if the MRAM device 101 is in the proper switching state. The resistance meter 126, on the other hand, provides a relatively fine (precise) resistance measurement but may be significantly slower than the qualifier 124.

In one implementation, the qualifier 124 may be a comparator that receives the read signal from the MRAM device 101, via the probe card 106, and compares the read signal to a desired target level. The target level may be adjustable. The comparison of the read signal to the target level may be used to determine whether the MRAM device 101 switched properly, switched improperly, or failed to switch. The qualifier 124 sometimes may be referred to herein as comparator 124, but it should be understood that the qualifier 124 is not limited to a comparator 124, unless otherwise specified. In some implementations, the comparator 124 is an analog comparator circuit, which may be useful to increase the speed of the first tier measurements in the switching detection circuit 120, relative to digital circuits. In other implementations, however, the comparator 124 may be a digital circuit. In some implementations, the comparator 124 may include multiple comparator circuits each with a different desired target level so that the read signal from the MRAM device 101 may be compared to multiple target levels simultaneously. In other implementations, the qualifier 124 may be a resistance meter that roughly measures the resistance value of the read signal, in a coarse-but-fast manner relative to the resistance meter 126, which is a separate circuit, and in comparison to qualifier 124, would be considered a relatively fine-but-slow resistance meter.

The switching detection circuit 120 may further include a resistance meter 126 for the second tier measurements, which may be any precise (e.g., more precise than the qualifier 124) resistance measurement circuit that measures the resistance value of the read signal received from the MRAM device 101 via probe card 106. The resistance meter 126 may be sometimes referred to herein as a resistance measurement circuit 126, and may include an analog to digital (ADC) converter. The resistance meter 126, for example, may be a separate circuit than the qualifier 124. In another implementation, the qualifier 124 and the resistance meter 126 may use the same circuit, but the number of repeated resistance measurements may be increased. For example, if a single resistance measurement is taken by the qualifier 124 for the high/low detection, then if there is a switching failure, rather than remeasuring with a separate circuit, the resistance may be remeasured with the same circuit, but with a different number of repetitions (which may be averaged) to generate a higher accuracy result, and thus, the same circuit functions as the resistance meter 126, although it is the same circuit as the qualifier 124. Thus, upon a switching fault error, the test may be paused and the measurement circuit will be changed in order to record a higher accuracy resistance measurement, where the measurement circuit change may be a) switching to a completely different circuit, e.g., from an analog comparator to a resistance measurement circuit with an ADC, or b) using the same circuit but increasing the number of measurement cycles to collect more resistance measurement results.

The switching detection circuit 120 may further include a controller 128 that is connected to the write pulse generator 121, the read bias generator 122, the comparator 124 and resistance measurement circuit 126. The controller 128 controls the timing and parameters of each test cycle for testing the MRAM device 101. Each test cycle, for example, includes a write operation and a read operation. The write operation may include the application of one or more write pulses, which may have varying parameters, and the read operation may include the application of one or more read bias, which may have varying parameters. The controller 128, for example, may control the number of test cycles and timing, e.g., the frequency and pausing and resuming the test cycles. For example, the controller 128 may control starting, stopping, pausing, and resuming the test cycles, as well as the frequency of test cycles and any additional tests performed while during the second tier measurements. The controller 128 may further control the writing and reading parameters, e.g., the polarity, magnitude, duty cycle, width, and the timing of the write pulse and read bias, as well as the testing parameters, e.g., one or more the target levels used in the comparator 124 and parameters of a magnetic field (if used) such as the polarity, magnitude and the cycle length.

The controller 128 may receive an output signal from the comparator 124 in response to the comparison of a read signal from the MRAM device 101 to the target level, which may be used to determine if the MRAM device 101 switched properly, switched improperly, or failed to switch. When a switching failure is detected in the first tier measurements, e.g., by the comparator 124, the controller 128 may pause the test cycles to provide time for an accurate measurement of the resistance value by the resistance measurement circuit 126. The controller 128 may receive the measured read resistance from the resistance measurement circuit 126 and may store the measured read resistance in memory 129, and may then resume the test cycles. While memory 129 is illustrated in switching detection circuit 120, the memory 129 may be located externally to the switching detection circuit 120, and in some implementations, may be located in computer 130. For example, the read resistance may be stored in memory 129 if the comparator 124 indicates a switching failure occurred, e.g., the MRAM device 101 failed to switch when it should or switched when it should not. The controller 128 may store additional parameters in memory 129, e.g., in association with a recorded resistance value, such as the cycle number when a failure occurs, the write pulse parameters associated with a failure event, the read bias parameters associated with a failure event, the target level or target levels used to determine a failure occurred.

When a switching failure is detected in the first tier measurements, e.g., by the comparator 124, the controller 128 may pause the test cycles and perform additional tests on the MRAM device 101 while the MRAM device 101 is in a failure state, including applying various write pulses, read bias, and various magnetic fields to the MRAM device 101, as discussed herein. The results and parameters of the additional tests may further be stored in memory 129, e.g., associated with a failure event.

The switching detection circuit 120 may be connected to a computer 130. The computer 130, for example, may control the switching detection circuit 120, such as the type of test performed and parameters of the test, and may receive the results of the test, e.g., as stored in memory 129. The switching detection circuit 120, thus, produces data that the computer 130 may receive, store, and analyze. The computer 130 includes the processor 132 with memory 134, as well as a user interface including e.g., a display 138 and user input devices 140. A non-transitory computer-usable storage medium 142 having computer-readable program code embodied may be used by the computer 130 for causing the processor 132 operate as a special purpose computer programmed to perform the various functions described herein. In some implementations, the storage medium 142 or another storage medium 142 may further store computer-readable program code to which may be used to configure the controller 128 in the switching detection circuit 120 to operate as a special purpose computer programmed to perform the various functions described herein. The data structures and software code for automatically implementing one or more acts described in this detailed description can be implemented by one of ordinary skill in the art in light of the present disclosure and stored, e.g., on a non-transitory computer readable storage medium 142, which may be any device or medium that can store code and/or data for use by a computer system such as processor 132. The computer-usable storage medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

For an STT-MRAM, which includes a single device that is both written and read, the read bias voltage will likely be less than the write voltage. But for an SOT-MRAM, where the switching device is physically different than the MTJ/reader, it is likely, but not required, that the write voltage and the read voltage do not have a relationship to each other.

It should be understood that while write pulse generator 121 and read bias generator 122 are illustrated in FIG. 1 as separate devices that have connections that are separate from the return connections for the qualifier 124 and the resistance meter 126, other configurations may be possible. For example, there are several applications, including a tester for an STT-MRAM device that may use a Bias Tee connection, or for an SOT-MRAM tester with a 3pin connection where the write pulse generator 121 is a separate circuit and connected to a separate pin on the probe card with respect to the read bias generator 122.

Figure 2:
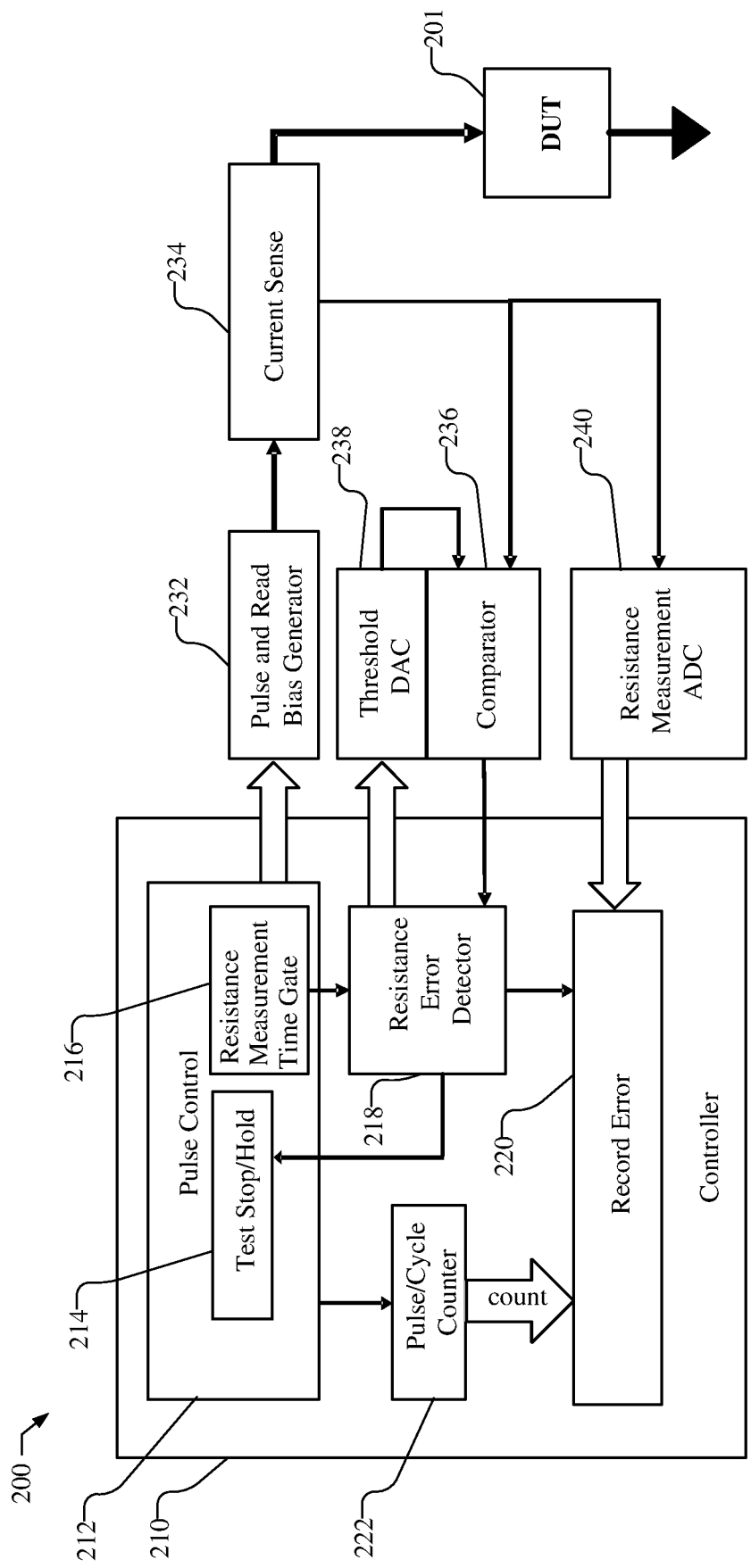
FIG. 2 is a block diagram illustrating an implementation of a switching detection circuit.

For example, in some implementations, e.g., for a tester for an STT-MRAM device as illustrated in FIG. 2 below, the read bias generator 122 may be a voltage source, where the read bias generator 122 may be set to a DC voltage level for measurement of the read signal with a current sense meter after the write pulsing is finished. The write pulse generator 121, serving as an AC pulse generator, may be physically separate from the read bias generator 122. The read bias generator 122 may be coupled to the comparator 124 and the resistance meter 126, either through a current-sensing mode (e.g., using a voltage bias and current sense) or voltage sensing mode (e.g., using a current bias and voltage sense). The current measurement is then used by the comparator 124 and the resistance meter 126.

In another implementation, e.g., for a tester for an STT-MRAM device, the write pulse generator 121, and the separate "DC" voltage bias generator 122, may be coupled together through a Bias Tee (not shown in FIG. 1), which is connected to the device under test (DUT). The write pulse generator 121 may be connected to the "AC" pathway of the Bias Tee, and the read bias generator 122 may be connected to the "DC" pathway of the Bias Tee. The current measurement may be performed using the DC voltage bias from the read bias generator 122 after AC pulsing by the write pulse generator 121 in the same manner as discussed above.

In another implementation, instead of using a voltage bias and current sense, the circuits may operate in a current bias and voltage sense configuration. For example, there may be a physically separate connection to the comparator 124 and resistance meter 126, e.g., as shown in FIG. 1. For example, the current bias and voltage sense configuration may be more accurate for resistance measurement, for example, which permits four point probing to eliminate contact resistance from the resistance result. As part of the "pause" of the test cycle when a switching failure is detected in the first tier measurement, another means of changing from coarse to fine measurements is that a coarse voltage bias and current sense mode may be changed to a fine current bias and voltage sense mode in order to measure and record the resistance of the failed state more accurately.

In another implementation, e.g., for tester for a SOT-MRAM device, which has a separate writer and reader and a separate probe pin connections for the writer and reader, there is no need to couple the write pulse generator 121 to the read bias circuit 121, comparator 124 or resistance meter 126.

Thus, the testing device 100 and in particular switching detection circuit 120 may include several configurations. For example, in a first configuration, the testing device may operate with STT or SOT MRAM, where STT-MRAM has 2 pin connections and writing/reading is applied via the same connections, and SOT-MRAM has 3 or 4 with a separate writer and reader (e.g., the 3 or 4 pins being dependent on whether ground (GND) is commonly shared between the writer and reader).

Additionally, in a second configuration the switching detection circuit 120 may use the same circuit or different circuits for the Write pulse generator 121 and read bias generator 122. For example, of an STT MRAM device configuration, the write pulse generator 121 and read bias generator 122 may be the same circuit. In this configuration, a single connection for the combined write pulse generator 121 and read bias generator 122 may be physically connected to the MRAM device 101 by a single probe pin. In some configurations, the write pulse generator 121 and the read bias generator 122 may be separated, e.g., which may be generally applicable for SOT MRAM device configurations. If the write pulse generator 121 and read bias generator 122 are separate, each may separately connect to the MRAM device 101 using separate probe pins. In another configuration, the write pulse generator 121 and read bias generator 122 may be separated, but may be coupled together using a Bias Tee, for additionally testing an STT-MRAM using a 2 pin connection.

Additionally, in a third configuration, the switching detection circuit 120 may be configured to use voltage biasing, e.g., read bias generator 122 may be a voltage generator. In some configurations, current biasing circuits may be used, e.g., read bias generator 122 may be current source.

Additionally, in a fourth configuration, the switching detection circuit 120 may be configured for different types of read measurements. For example, the qualifier 124 and resistance meter 126 may be coupled to a read biasing circuit. The qualifier 124 and resistance meter 126 may be coupled to the read bias generator 122. For example, if the qualifier 124 uses current sensing measurements, then the read bias generator 122 would be a voltage biasing circuit, and a sense resistor circuit would be included with which qualifier 124 may measure the read signal. If the qualifier 124 uses voltage sensing measurements, then the read bias generator 122 would be a current biasing circuit. In such an implementation, the qualifier 124 may have 4 point Kelvin-style sensing connections, e.g., within base 108, or may also include 4 pin probing all the way through probe card 106. Combined with the third implementation discussed above, the various techniques for measuring a resistance, which may be either of current bias/voltage sense (Ibias/Vsense) or voltage bias/current sense (Vbias/Isense) configurations or any number of other means of measuring resistance, for example, a Bridge Circuit, may be used. Additionally, qualifier 124 may use one technique (e.g., Vbias/Isense) for a coarse resistance measurement, whereas resistance meter 126 may use a different technique (e.g., Ibias/Vsense) for a fine resistance measurement, in which case the read bias generator 122 may be switchable between Ibias and Vbias modes. To support these different biasing and measurement techniques some of the supporting circuitry may be within base 108 (e.g., a sense resistor, or 4 point probes).

Additionally, in a fifth configuration, the switching detection circuit 120 may be configured with a secondary write pulse circuit. For example, as discussed above, the read bias generator 122 may be configured as a secondary write pulse circuit, which may be used for SOT or STT-with-Bias-Tee configurations. For generalization, the secondary write pulse circuit, similar to write pulse generator 121, may also be produced from a voltage or current source, or any other means of generating a pulse. There may be no corresponding "read" measurement for secondary write pulse circuit. However, for SOT-MRAM device testing, there may be a corresponding "read" measurement to measure the resistance of the SOT Writer. For this purpose, there may also be measurement capability coupled to secondary write pulse circuit. For example, a second resistance meter, similar to resistance meter 126 may be used.

In general, a failure in a MRAM devices, such as failing to switch when it should or switching when it should not, is a low-likelihood event. For example, under nominal operating conditions, a failure may not occur or may occur only one out of a million operations. Testing an MRAM device for a failure event, accordingly, requires a high-repetition of operations. In order to have practical value, the testing device 100 must be able to perform a large number of operations on the MRAM device 101 in a short amount of time to detect and measure as many failure events as possible. Thus, for example, the controller 128 may control the write pulse generator 121, read bias generator 122 and qualifier 124 to perform a plurality of test cycles, e.g., 10,000 test cycles or more, at high frequency, e.g., a frequency greater than 10 kHz. For example, the read operation may be performed in less than 10 µs after the write operation. In some implementations, the read operation may be performed in less than 5 µs, or less than 2 µs after the write operation. The use of an analog comparator circuit as the comparator 124 may be used to accurately detect failures while performing write and read operations at a desired high frequency. In some implementations, the comparator 124 may be a digital comparator circuit, but the frequency of operations may need to be reduced. Additionally, controller 128 may pause the operations after a failure event is detected so that the resistance value may be measured by the resistance measurement circuit 126 and stored in memory 129. The controller 128 may further pause the operations after a failure event is detected so that additional tests may be performed on the MRAM device 101 while it is in a failure state.

During testing, the controller 128 may control the write pulse generator 121 to apply a suitably high positive (or negative) voltage pulse with a certain pulse width and amplitude to the MRAM device 101 to cause the MRAM device 101 to switch from a low to high resistance state, or from a high to low resistance state. For a typical STT-MRAM device, the write pulse may have a 10 ns pulse width and +/−500 mV amplitude, while for typical a SOT device, the write pulse may have a 1 nS pulse width and +/−1V amplitude. The MRAM device 101 may be characterized by applying a voltage pulse with the write pulse generator 121 with increasingly larger amplitudes (with a constant pulse width), or increasingly wider pulse widths (with a constant amplitude), or a combination of larger amplitudes and pulse widths. By way of example, the voltage pulse may be varied by +/−600 mV and the pulse width may be varied by 10 ns. After each voltage pulse, the read signal from the MRAM device 101 may be tested to determine if the MRAM device 101 switched states appropriate, e.g., in order to determine voltage amplitudes and pulse widths that will assure a write operation.

In some implementations, a positive or negative magnetic field may be applied to the MRAM device 101 during testing, e.g., Field Assist. A characterization of the MRAM device 101 may be performed by sweeping the magnetic field, e.g., by +/−500 Oe, while monitoring the read Resistance to determine the magnetic field magnitude that causes the MRAM device 101 to switch states. The magnetic field parameters, e.g., such as the offset between positive and negative field magnitudes, that result in a switch (or a switching failure) may be stored in memory 129 within the switching detection circuit 120 or computer 130. In some implementations, a combination of magnetic field may be used as a nominal assist field with voltage pulses may be applied to the MRAM device 101 to determine characteristics of the MRAM device 101 with lower pulsing conditions (lower voltages and/or smaller pulse widths).

When measuring the resistance of a MRAM device 101, the read bias generator 122 may be controlled to provide a suitably low read voltage. The read voltage may be high enough to accurately produce a read signal and measure the resistance value from the MRAM device 101, but low enough that it does not cause a Write to occur. For example, the read voltage may be 50 mV. In some implementations, the read voltage may be increased to determine whether the MRAM device 101 improperly switches.

Under normal circumstances, the MRAM device 101 should switch between a high resistance and low resistance state. Accordingly, the target level used in the comparator 124 may be set at a 50% threshold to determine whether switching occurred. For example, an MTJ device may have a high resistance state of 5K ohms, and a low resistance state of 1.5K ohms, and, thus, the target level of the comparator 124 may be set at 3.25K ohms (50%) to determine if the device is in a low state or a high state. For example, an analog comparator may be pre-programmed at the 50% level, or a digital comparator may be use a digital threshold. Thus, for example, a relatively low read voltage may be applied to the MRAM device 101 and the read signal, e.g., the current or voltage, or some other characteristic that is proportional to the read resistance in the MRAM device 101 is compared to the threshold value. In some implementations, instead of using a single 50% threshold, the target level of the comparator 124 may be adjusted between a low threshold and a high threshold. For example, less than 25% may be considered a low state threshold and greater than 75% may be considered a high state threshold. Thus, the target level of the comparator 124 may be set to 1.625K ohms for a low state threshold (i.e., a device with resistance detected to be less than 1.625K ohms would be considered in low state) and 4.875K ohms for a high state threshold. In this example any time the detector detects the resistance of the device to fall within this middle 50% range (1.625K to 4.875K ohms) the detector would trigger this as a switching failure under either high/low target condition.

For an MRAM device 101 that has 3 or more resistance states, e.g. high resistance, low resistance, and medium resistance, the target levels of one or more comparators may be configured to detect if the device has a switching failure. While "high" and "low" resistance states are typically described herein, it should be understood that any MRAM device producing any number of predictable resistance states as determined by any variation of write operation characteristics may be allowed. Further, some tests, e.g. those tests that perform rewriting of the same polarity, may use one or more comparators 124 with thresholds set below and above the expected resistance state, to determine if the resistance goes beyond the expected high (or low) resistance level. For example, for a device with high resistance state of 5K ohms the threshold for comparator 124 may be set to 6.25K ohms, to detect if the high resistance state exceeds 25% over-resistance margin, which may then be detected as a failure condition.

Testing device 100 may perform different types of high repetition tests, e.g., more than 10,000 cycles or more than 100,000 cycles, on the MRAM device 101, e.g., to detect one or more low-likelihood failures. The test cycles are performed at high frequency. For example, the frequency may be greater than 10 kHz. In some implementations, the read operation in a test cycle may be performed in less than 10 µs after the write operation. In some implementations, a test cycle may be less than 5 µs, or less than 2 µs or less than 1.5 µs. For example, in one implementation, the testing device 100 may perform an Error Rate test, in which a large number of writing and reading operations are performed. For example, the MRAM device 101 may be repeatedly switched between low and high states and after each switching operation, the read signal is tested to determine if the MRAM device 101 properly switched. The number of switching failures may be reported as a result of the Error Rate test. When a switching failure is detected additional switching performance parameters may be measured and recorded, such as the read resistance and the cycle count when the failure occurred. Further, tests may be performed while the MRAM device 101 is in a failure state, such as a write pulse or external magnetic field that may be applied to cause the MRAM device 101 to correct the switching error.

Another high-repetition test that may be performed is an Endurance test, in which the MRAM device 101 is either repeatedly switched between a high and low state, or switched to one state then repeatedly rewritten to the opposite state, and after a plurality of these switching operations the read signal is tested to determine if the MRAM device 101 is in a proper state. A write/reset sequence prior to each single read may be used, e.g., a write pulse of both polarities is applied to switch the device back and forth (e.g., with the option of using different pulse width and amplitude characteristics for the set and reset pulses), or a series of rewrites at a single polarity may be used. After the write/reset sequence is applied for N times, a single read signal may be tested by the resistance meter 126. For example, the MRAM device 101 may be switched between a high and low state 10 or more times before a read voltage is applied and the read signal is tested for a switching failure. In some implementations, the test may incrementally sweep the number of cycles before each read, such as 10×, then 100×, then 1000×, etc. Similar to the Error Rate test, the number of switching errors may be recorded, along with the write pulse parameters, e.g., the number of switches, amplitudes, pulse widths, etc. In addition to detecting a high/low switching error, the one or more comparator circuits 124 may be configured to determine whether the device resistance increases (or decreases) beyond the expected high (or low) resistance state, and this over/under condition may also be considered a switching failure. This mode may be particularly useful when the Endurance test utilizes a series of rewrites with a single polarity. Additionally, switching performance parameters, such as the read resistance and the cycle count, may be recorded when the failure occurs. Further, tests may be performed while the MRAM device 101 is in a failure state, such as a write pulse or external magnetic field that may be applied to cause the MRAM device 101 to correct the switching error. In addition, an Error Rate test may be performed during the Endurance Test, in which the tester monitors for any failures, and captures the state of the device for any failure during those N rewrites, to get additional information about the Endurance failure, such as when and how many times the failure occurred, and the resistance at the time of a switching failure. For example, the qualifier 124 may be used to detect whether the MRAM device 101 switched after each write operation, i.e., after each write and after each reset operation.

Another high-repetition test that may be performed is a Read Disturb test, during which a write pulse is applied to the MRAM device 101 and multiple read voltages are varied at increasing magnitudes. A switching error is detected when the state of the MRAM device 101 switches due to the read voltage, or if the resistance of the device exceeds a margin beyond the current state resistance. In one implementation, a single cycle may be performed using a single write pulse to set a stage of the MRAM device 101 and multiple reads are performed. In some embodiments, however, multiple write pulses may be used. The read voltage may be increased over time within a cycle until the MRAM device 101 switches state. Multiple cycles may be performed to show a percentage error, and the MRAM device 101 is reset (re-write) after it switches. The number of detected switching errors may be recorded, along with the read voltage that caused the switching error. Additionally, switching performance parameters, such as the read resistance and the cycle count, may be recorded when a switching failure occurs.

It should be understood that "switching failure" as used herein indicates any event in which an incorrect or unexpected response is detected by the first tier measurement and is not limited any particular measurement algorithm. For example, a switching failure may include an unexpected switch between resistance states, an unexpected non-switching between resistance states, or an unexpected resistance variation that is above or below the expected resistance state by a predetermined margin. Therefore a "switching failure" may be generally defined herein by any sort of switching failure, failure condition, failure event, failure state, or failure, and should be considered like terms.

FIG. 2 is a block diagram illustrating an implementation of a switching detection circuit 200, which may serve as the switching detection circuit 120 in FIG. 1 for a typical STT-MRAM device. As illustrated, the switching detection circuit 200 includes a controller 210. The controller 210 may be an intelligent hardware device, e.g., such as a central processing unit (CPU), a microcontroller, microprocessor, an application specific integrated circuit (ASIC), Field Programmable Gate Array (FPGA), etc. The controller 210 may be configured by software stored in computer readable storage medium 142 shown in FIG. 1, or separate computer readable storage medium or memory, to cause the controller 210 to operate as a special purpose computer programmed to perform the various functions described herein. Alternatively, controller 210 may be configured to perform the various functions described herein. The description may refer only to the controller 210 performing a function, but this includes other implementations such as where the controller 210 executes software and/or firmware. The description may refer to the controller 210 performing a function as shorthand for one or more of the controllers performing the function. The description may refer to the switching detection circuit 200 performing a function as shorthand for one or more appropriate components of the switching detection circuit 200 performing the function. The controller 210 may include a memory with stored instructions in addition to and/or instead of the computer readable storage medium 142 shown in FIG. 1. Functionality of the controller 210 is discussed more fully below.

The controller 210 may include a pulse control 212 that may be used to control the pulse/cycle generator 222, which generates the write pulse for writing to a MRAM device under test (DUT) 201 and the read voltage to generate a read signal from the MRAM DUT 201. The pulse control 212, for example, may control the number of operations, e.g., write and read sequence cycles, the timing and frequency of the cycles, polarity, amplitude, and pulse widths of the write pulse, as well as the parameters of the read voltage. The pulse control 212 may include a test stop/hold function 214, which may be used to pause the write and read sequence operations for testing the MRAM DUT 201, e.g., when a failure event is detected. For example, the operation cycles controlled by the pulse control 212 may occur at high frequency and the test stop/hold function 214 may be used to pause the operations when a failure event is detected so that there is time to measure and record switching performance parameters, such as the read resistance value. Moreover, the test stop/hold function 214 may pause the operations when a failure event is detected so that additional tests may be performed on the MRAM DUT 201 while it is in an error state. The pulse control 212 may further include a resistance measurement time gate 216, which may be used to gate the detection of a failure event by the resistance error detector 218, e.g., so that determination of whether a failure event occurs is performed during application of a read voltage and not a write pulse.

The pulse and read bias generator 232, sometimes referred to herein simply as the pulse generator 232, is a voltage generator that produces a write pulse and read voltage having characteristics controlled by the pulse control 212. A current sense circuit 234 may be a current sense amplifier that detects the current flowing through the MRAM DUT 201, which is proportional to the read resistance in the MRAM DUT 201, and outputs a read signal that is proportional to the read resistance. The read signal may be for example, a voltage, a current, or other signal that is proportional to the resistance of MRAM DUT 201. For example, the current sense circuit 234 may be a current-sense resistor that converts the load current in the MRAM DUT 201 to a small voltage, which may then be amplified by a current-sense amplifier. The current sense circuit 234 may be disposed between the pulse generator 232 and the MRAM DUT 201 or between the DUT 201 and ground.

As illustrated in FIG. 2, a single circuit, e.g., the pulse generator 232, may be used to produce both the AC Pulsing and also the after-pulse read voltage. However, in other implementations, separate circuits may be used as the AC pulse circuit and the DC read bias source, which may be coupled together through a Bias Tee for STT-MRAM or maintained as separate circuits for SOT-MRAM. Each of these circuits may be voltage or current sources, and correspondingly the readback signal may be a voltage bias and current sense or may be a current bias and voltage sense configuration. For STT, the single (2pin) output of the Bias Tee may be connected to any STT-style DUT 201.

The read signal that is output of the current sense circuit 234 is received by a comparator 236, which may be an analog comparator. The comparator compares the read signal, which may be a voltage signal proportional to the read resistance in the MRAM DUT 201, to a target value, i.e. threshold. The threshold may be controlled by the resistance error detector 218 in controller 210, for example, the threshold may be a 50% value of the nominal high and low resistance states. A high resistance value and a low resistance value of the MRAM DUT 201, for example, may be measured prior to testing, and the 50% value may be based on the measured values. Alternatively, the threshold may be a fixed value used for all MRAM DUT 201, e.g. based on a 50% resistance value for a sampling of MRAM devices. The resistance error detector 218 may adjust the threshold, e.g., to 25%, 75%, 125% or other values during testing of the MRAM DUT 201. The resistance error detector 218 may provide a digital threshold signal to a threshold digital to analog convert 238, which provides the analog threshold to the comparator 236. In some implementations, the comparator 236 may be a digital comparator, e.g., with an analog to digital converter that converts the analog read signal to a digital signal, and the resistance error detector 218 may provide a digital threshold signal directly to the comparator 236. The comparator 236 generates a comparison signal in response to the comparison between the read signal and the threshold that is provided to the resistance error detector 218.

The resistance error detector 218 receives the comparison signal from the comparator 236 and determines whether a switching error occurred in the MRAM DUT 201. The resistance error detector 218 may determine a switching error has occurred, for example, if the comparison signal indicates that the read signal value is greater than the threshold value, when the MRAM DUT 201 is supposed to have switched from a high resistance state to a low resistance state, or conversely if the comparison signal indicates that the read signal value is less than the threshold value, when the MRAM DUT 201 is supposed to have switched from a low resistance state to a high resistance state. The resistance error detector 218 may further determine a switching error has occurred, e.g., if the comparison signal indicates that a switch in resistance state occurred in the MRAM DUT 201 when the MRAM DUT 201 was not supposed to switch resistance state. The resistance error detector 218 may provide a failure signal to a record error function 220 to indicate that a failure event occurred to cause the record error function 220 to record switching performance parameters of the MRAM DUT 201 for the switching failure. The resistance error detector 218 may further provide a signal to the test stop/hold function 214, which may pause the write and read sequence operations for testing the MRAM DUT 201 after a failure event has been detected in order to allow time for the switching performance parameters to be measured and recorded.

The read signal that is output of the current sense circuit 234 may be received by a resistance measurement ADC 240. Similar to the resistance meter 126, discussed above, the resistance measurement ADC 240 converts the value of the analog read signal to a digital value, which may then be stored in memory. It should be understood that the value of the analog read signal may be a current value or a voltage value, which are proportional to the resistance of the MRAM device. The resistance measurement ADC 240 may include a resistance measurement circuit to specifically measure the resistance value of the MRAM device based on the read signal, which is converted to a digital value. In some implementations, the resistance measurement ADC 240 may digitize a current or voltage value of the read signal, which may be converted to a resistance value after digitization. The resistance measurement ADC 240, thus, may thus digitize and store current, voltage, or resistance values. The resistance measurement ADC 240 receives the read signal and converts the analog read signal to a digital value that may be provided to the record error function 220 of the controller 210 as a switching performance parameter. The digital value produced by the resistance measurement ADC 240 is proportional to the read resistance in the MRAM DUT 201. The record error function 220 may be controlled to store the value of the read signal provided by the resistance measurement ADC 240 as a switching performance parameter in on-board or off-board memory in response to the failure signal from the resistance error detector 218 indicating the detection of a failure event.

As illustrated, the controller 210 may further include a pulse/cycle counter 222. The pulse/cycle counter 222 receives signals from the pulse control 212 indicating when an operation is performed and counts the number of cycles. The pulse/cycle counter 222 may provide the cycle count to the record error function 220, which may store the value of the cycle count as a switching performance parameter in on-board or off-board memory in response to the failure signal from the resistance error detector 218 indicating the detection of a failure event.

Figure 3A:
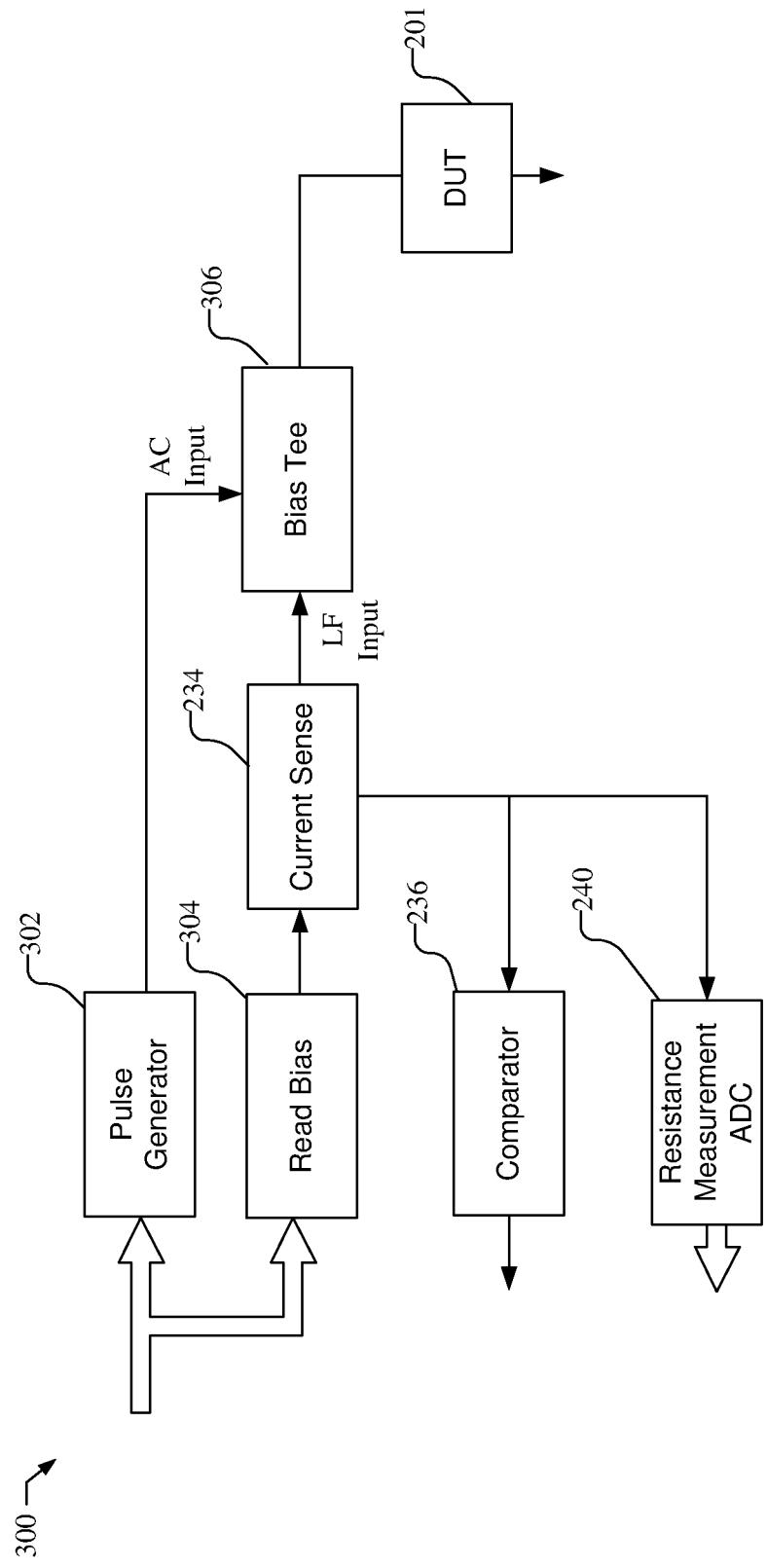
FIGS. 3A and 3B are block diagrams illustrating implementations of the pulse and read bias generator circuit.
Figure 3B:
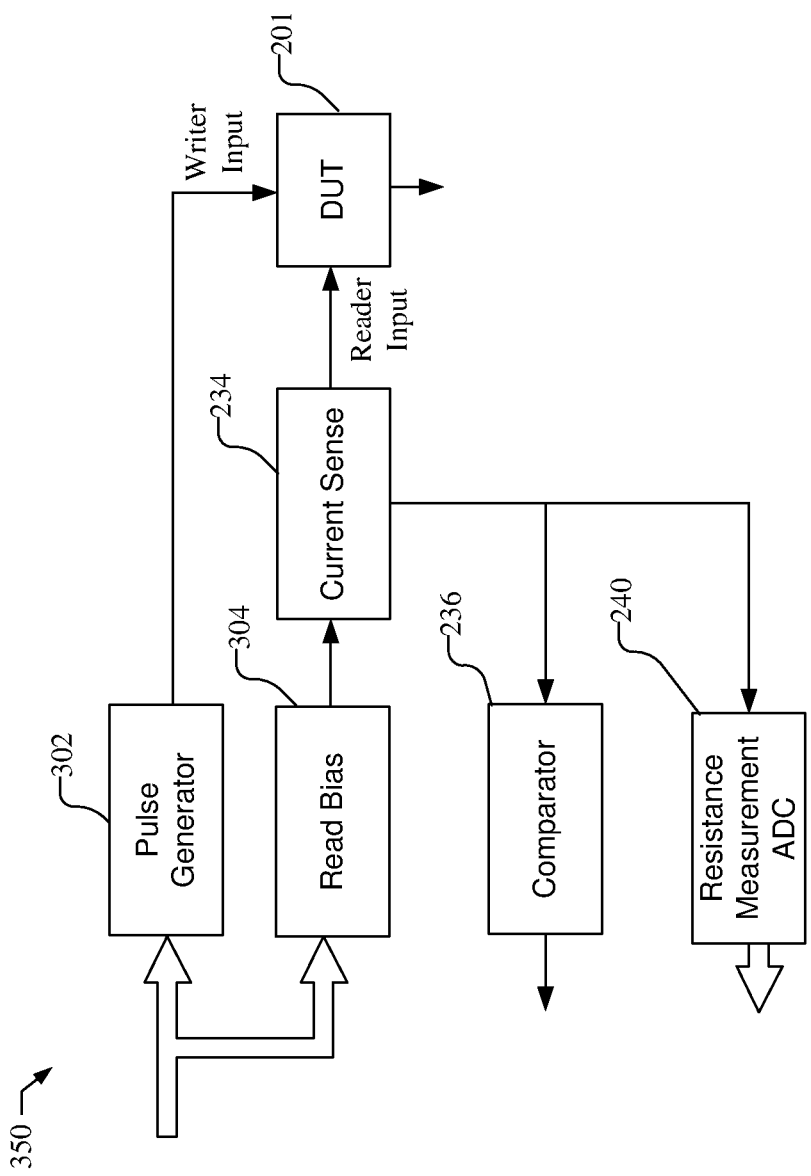

FIGS. 3A and 3B are block diagrams illustrating a portion of the switching detection circuit 200 from FIG. 2, like designated elements being the same, but illustrate the use of separate circuits for AC pulse circuit and the DC read bias source. FIG. 3A, for example, illustrates a circuit 300 that includes a separate pulse generator 302 and read bias source 304, which may be used in place of the pulse and read bias generator 232 shown in FIG. 2. As illustrated, the pulse generator 302 provides an AC input to the Bias Tee 306, and the read bias source 304 is coupled to the current sense 234, which provides a low frequency (LF) input to the Bias Tee 306. The output of the Bias Tee, for example, is a 2 pin output that may be connected to any STT-style DUT 201.

FIG. 3B illustrates a circuit 350, which is similar to circuit 300, but does not include the Bias Tee 306. Thus, the pulse generator 302 provides a Write input to the DUT 201, and the read bias source 304 is coupled to the current sense 234, which serves as the reader input to the DUT. The circuit 350, thus, provides a 3 pint output to any SOT-style DUT 201.

In some implementations, circuit 300 and circuit 350 may be combined, in which the Bias Tee and resistance measurement connection to a 2 pin device may be connected to the Write device on a SOT DUT 201, and also connect another read bias source 304 and current sense circuit 234 to the reader portion of the SOT DUT 201.

Thus, as illustrated in FIGS. 3A and 3B, the read bias source may be a voltage biasing source with a current sensing subcircuit. These two circuits may be entirely different circuits, such as with the use of a switch, in case of low-accuracy connection to the comparator 236 vs. high-accuracy connection to the resistance measurement ADC 240. As an example, the resistance measurement ADC 240 may include its own higher-accuracy reader biasing source, which could be of a current-biasing (Ibias) and voltage sensing design, which could also therefore have 4 pt (Kelvin) connection to the reader on the DUT 201, with a switch to select which of these two read bias sources (and measurement circuits) would be connected to the reader device on the DUT 201. In the case of a "pause" of a switching failure, the switch may be toggled to take a more accurate resistance measurement by not only changing the measurement circuitry but by also changing the biasing circuitry, and even changing the method of the resistance measurement to, for example, current bias and voltage sense mode, or a bridge-circuit measurement, or other known methods for measuring resistance with high accuracy.

In some implementations, the switching detection circuit 200 may include multiple comparators, that may use different thresholds, e.g., controlled by resistance error detector 218 and threshold DAC. By way of example, based on the nominal high and low resistance states, a first comparator may use a 25% threshold value, a second comparator may use a 50% threshold value, and a comparator may use a 75% threshold value. Other thresholds may be used if desired, including thresholds that may be higher and lower than the high and low resistance states.

Thus, the read signal may be compared to a plurality of threshold values to determine not only whether a switching failure occurred in the MRAM DUT 201, but an approximate resistance value, e.g., greater than 25%, 50% or 75%. In some implementations, additional comparator circuits with additional thresholds may be used to provide greater resolution in the resistance values. If desired, fewer comparator circuits may be used, e.g., with a low and high thresholds. In some implementations, e.g., if the comparators provide sufficient resolution, the appropriate threshold value may be stored by the record error function 220 as the approximate read resistance value when a failure event is detected and the resistance measurement ADC 240 may be unnecessary. In this implementation, for example, it may be unnecessary to pause the operations of the pulse control 212 to detect and record approximate resistance values based on the output of the multiple comparators.

Figure 4A:
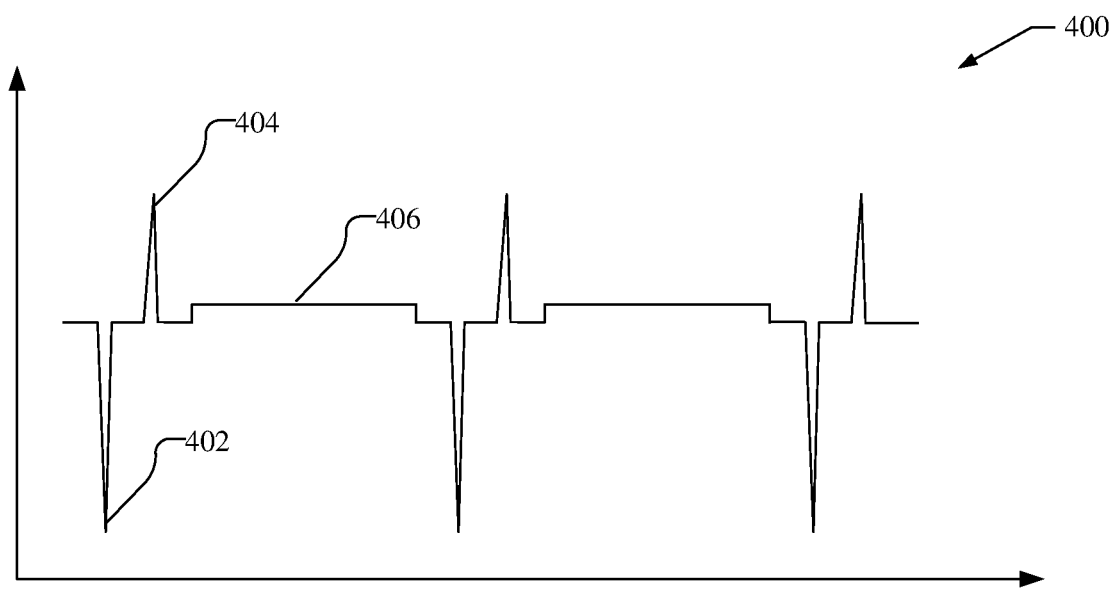
FIGS. 4A, 4B, 4C, and 4D show graphs illustrating voltages applied during write operations and read operations during various tests.

FIG. 4A is a graph illustrating write operations and read operations for a number of test cycles during a fast error rate test 400. As illustrated, an initial write pulse 402 with a first polarity and amplitude is applied as a reset pulse, followed by a second write pulse 404 having an opposite polarity and a smaller amplitude is applied as a set pulse, followed by a read bias signal 406, during which the first tier measurement is performed to determine if the MRAM device under test properly switched. Both write pulses 402 and 404 may have the same pulse width, e.g., 10 ns. The reset pulse 402 may have an amplitude of −750 mV, the set pulse 404 may have an amplitude of +500 mV, and the read bias 406 may have a voltage of +50 mV. The pulse width, amplitude and polarities may be varied. The comparator 236 requires a finite amount of time to settle, e.g., 1 µs, before it can be reliably used to determine if the MRAM device switched. Accordingly, the comparator output may be determined at the end of the read bias 406 period. Based on these configurations, each test cycle may be 1.3 µs long resulting in a frequency of e.g., 788 kHz for the error rate test 400, although this may be varied.

Figure 4B:
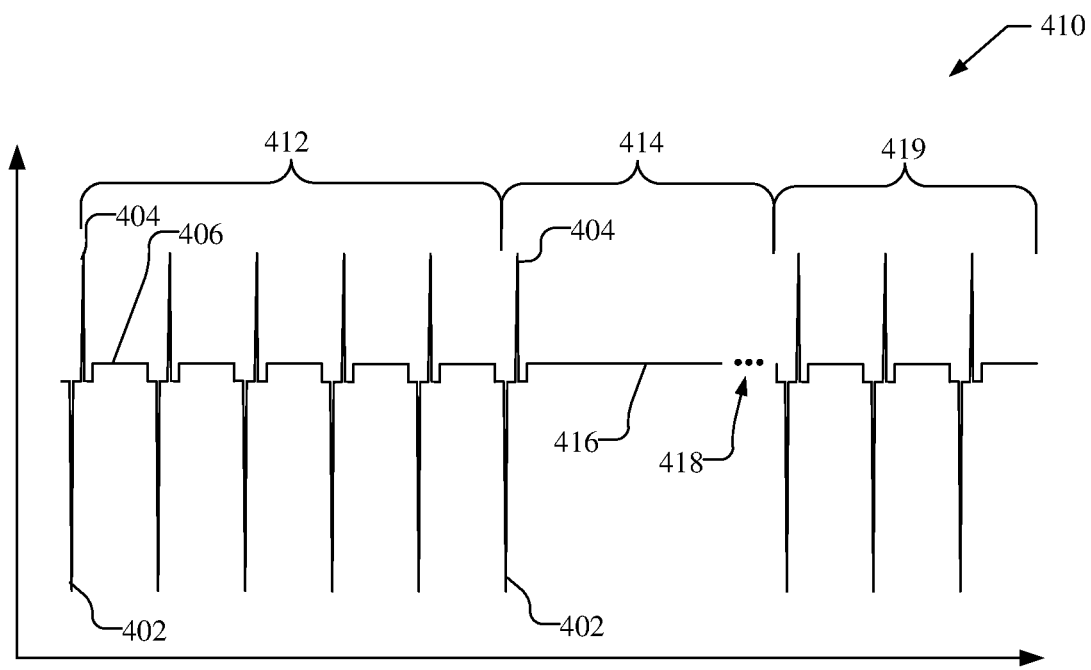

FIG. 4B is a graph illustrating write operations and read operations for a number of test cycles during a fast error rate test 410 in which a switching failure occurs. The graph of FIG. 4B is similar to that shown in FIG. 4A, like designated elements being the same, except that additional test cycles are illustrated and a test cycle is paused after a switching failure is detected. Specifically, during a plurality of test cycles 412, an initial write (reset) pulse 402 followed by a second write pulse 404, and a read bias signal 406, are applied to the MRAM device, and the test cycles are performed at an initial frequency. During test cycles 412, the first tier measurement performed by, e.g., comparator 236, does not detect a switching failure.

During test cycle 414, however, first tier measurement performed by, e.g., comparator 236, detects a switching failure. The test cycle may be paused as illustrated by extended read bias signal 416 during test cycle 414, to perform second tier measurement(s) to measure and store one or more switching performance parameters of the MRAM device while the MRAM device is in a switching failure state. By pausing the test cycles, sufficient time is provided to perform the second tier measurements, which, in this example, are slower than the first tier measurement performed by, e.g., comparator 236. For example, the second tier measurement may be relatively precise resistance measurement, e.g., performed by resistance measurement ADC 240. The resistance of the MRAM device may be measured during read bias signal 416, while the test cycles are paused, and stored in memory.

In some implementations, the second tier measurement may not be initiated until after the first tier measurement is complete and a switching failure is detected. In another implementation, the second tier measurement may be initiated at the same time as the first tier measurement, but due to the longer measurement period required by the second tier measurement, the extended read bias signal 416 is used in order for the second tier measurement to complete the measurement of the switching performance parameter, e.g., resistance value. In yet another implementation, the second tier measurement may be performed within the time provided by the read bias signal 406, e.g., the first tier measurement and the second tier measurement are performed simultaneously and the extension of the read bias signal (as shown by extended read bias signal 416) is not necessary, and the switching performance parameter of the MRAM device that is measured by the second tier measurement is stored if the first measurement tier detects a switching failure. For example, in one example, the switching performance parameter of the MRAM device that is measured by the second tier measurement is only stored if the first measurement tier detects a switching failure.

Additionally or alternatively, as illustrated by ellipsis 418, the test cycle 414 may be paused and the second tier measurement may include one or more other types of tests, such as using various magnetic fields, generating write pulse(s), or generating read bias(es) of any number of width and amplitude conditions or off and on conditions and measuring the read signal from the MRAM device or determining if the MRAM device switches, as described herein. In some implementations, the second tier measurements may include both the resistance measurement, e.g., by resistance measurement ADC 240, and one or more of the tests, e.g., applying various magnetic fields, generating write pulse(s), or generating read bias(es) of any number of width and amplitude conditions as described herein, or may include only the resistance measurement or only one or more of the tests.

Once the second tier measurement to measure and store the one or more switching performance parameters of the MRAM device while the MRAM device is in a switching failure state, the test cycles are resumed with the initial frequency, as illustrated by test cycles 419.

Figure 4C:

FIG. 4C is a graph illustrating write operations and read operations for a number of test cycles during a voltage switch test 420. As illustrated, each test cycle includes a write pulse 422 followed by a read bias signal 424, during which the first tier measurement is performed to determine if the MRAM device under test properly switched, i.e., in this instance to determine at what cycle the MRAM device does switch. An initial reset pulse (not shown) may be applied, before the test. As illustrated, each write pulse 422 may have the same polarity. Moreover, as illustrated, the amplitude (and/or the pulse width) of the write pulses 422 may increase over cycles. The voltage switch test 420 is to determine the voltage of the write pulse at which the MRAM device first switches. Once the MRAM device switches, the test may be aborted and the voltage that caused the first switch may be recorded as the Switching Voltage.

Figure 4D:
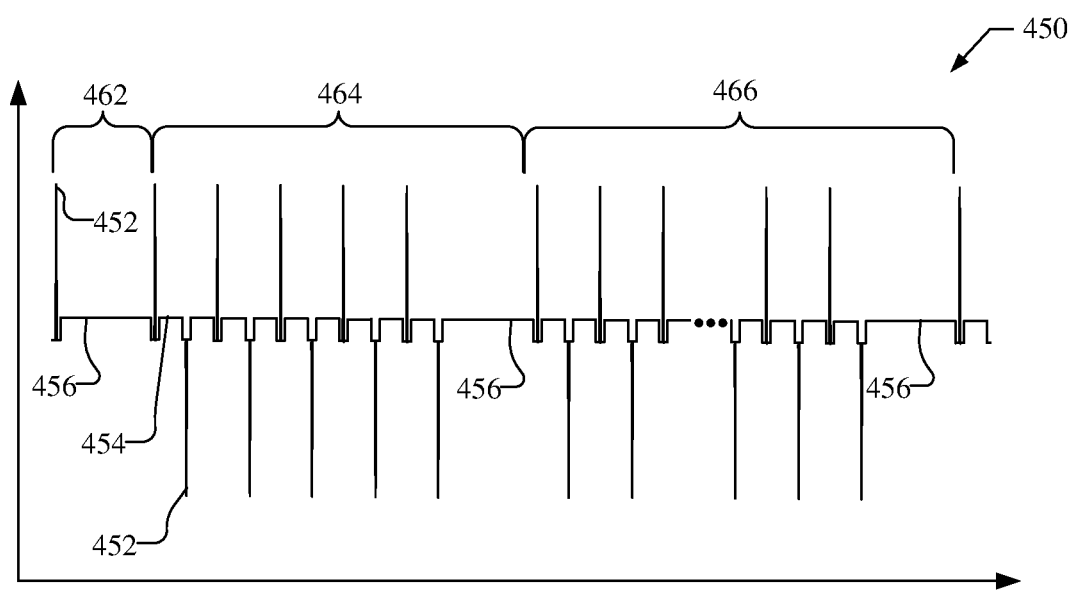

FIG. 4D is a graph illustrating write operations and read operations for a number of test cycles during an endurance test 450. As illustrated, a plurality of test cycles are performed at high frequency with a write operation, e.g., a write pulse 452 followed by read operation, e.g., a read bias signal 454, during which the first tier measurement is performed to determine if the MRAM device under test properly switched. The polarity of the write pulses 452 may alternate as illustrated, or may be all of the same polarity. For this test the write pulse width and amplitude, and number of write pulses, and number of sets may be user definable and may be varied between sets. As illustrated, the endurance test may include sets of a number of write pulses that, in some implementations, may increase in the number of write pulses logarithmically (e.g., 1, 10, 100, 1000, etc.), and after each set an accurate resistance measurement, e.g., a second tier measurement, may be performed. For example, as illustrated, test cycle 462 includes 1 write pulse followed by an extended read bias signal 456 to perform the resistance measurement, e.g., by the resistance measurement ADC 240. Test cycle 464 includes 10 write pulses followed by a short read bias signal 454 during which a first tier measurement is performed, and the set of 10 write pulses is followed by an extended read bias signal 456 to perform the resistance measurement, e.g., by the resistance measurement ADC 240. Test cycle 466 may include 100 write pulses, each followed by a short read bias signal 454 during which a first tier measurement is performed, and the set of 100 write pulses is followed by an extended read bias signal 456 to perform the resistance measurement, e.g., by the resistance measurement ADC 240. If, after any write pulse 452 during the endurance test, the first tier measurement performed using read bias signal 454 determines that the MRAM device failed to switch property, the test cycle may be paused and a second tier measurement performed, e.g., as discussed in cycle 414 of FIG. 4B, with a change in amplitude and/or pulse width between each sweep.

Figure 5A:
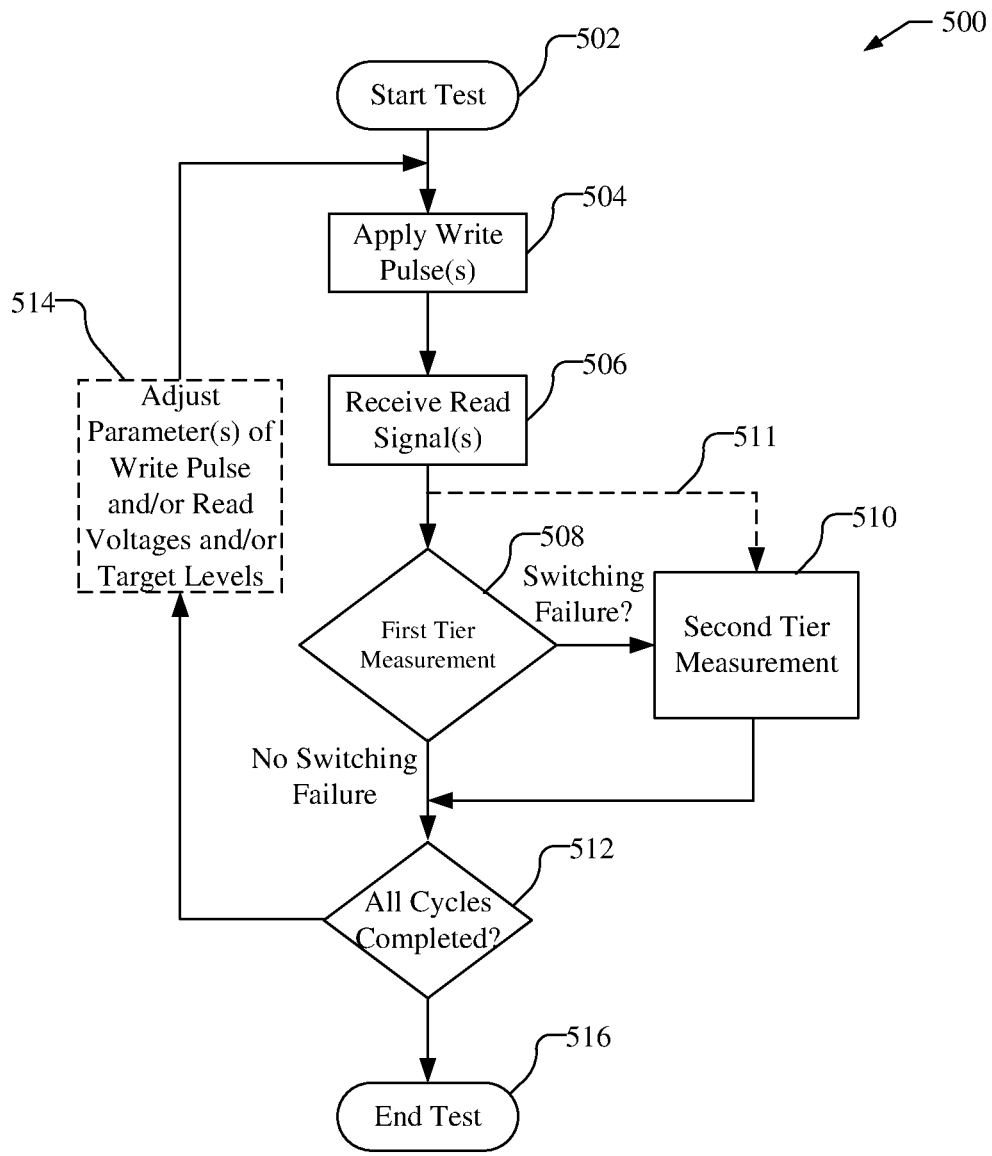
FIGS. 5A and 5B show flow charts illustrating processes of testing an MRAM device with a high repetition testing device.

FIG. 5A shows a flow chart illustrating a process 500 of testing an MRAM device with a high repetition testing device, such as testing device 100 or switching detection circuits 200, or 300. As illustrated, after starting the test (502), one or more write pulses are applied to an MRAM device (504). A write pulse, for example, is a voltage pulse that may have a specific characteristic, such as voltage polarity, amplitude and pulse width. The write pulse, for example, may be produced by the write pulse generator 121 in response to the controller 128 shown in FIG. 1 or pulse generator 232 in response to the pulse control 212 shown in FIG. 2, and is provided to the MRAM device, e.g., via the probe card 106. In some implementations, a single write pulse may be applied. In other implementations, a plurality of write pulses may be applied, e.g., with alternating or varying characteristics, such as alternating polarities and/or amplitudes and/or pulse widths.

After the one or more write pulses are applied, one or more read signals may be received from the MRAM device (506). A read signal may be received, for example, by applying a read voltage, e.g., a low bias voltage, that is high enough to produce a current through the MRAM device, with which the resistance state of the MRAM device may be detected, but low enough that the bias voltage does not write to the MRAM device. By way of example, the read signal may be received by applying a read voltage using the read bias generator 122 in response to the controller 128 shown in FIG. 1 or pulse generator 232 in response to the pulse control 212 shown in FIG. 2, and is provided to the MRAM device, e.g., via the probe card 106. The read signal may be received via the current sense circuit 234 and may be received by, e.g., comparator 124 and resistance measurement circuit 126 in FIG. 1, and comparator(s) 236 and resistance measurement ADC 240 shown in FIG. 2. In some implementations, a single read signal may be received. In other implementations, multiple read signals may be received, e.g., using read voltages having varying characteristics, such as increasing DC amplitudes.

The sequence of applying one or more write pulses (504) and receiving one or more read signals (506) may be considered a single test cycle, which will be repeated at high frequency for a large number of cycles as discussed herein, to perform a high repetition test for a low-likelihood failure event. In one implementation, the write operation and read operation applied to the MRAM device may include toggling between a high write pulse and a low write pulse and receiving a read signal from the MRAM device after each write pulse. For example, in some implementations, a single write pulse may be applied (504) and a single read signal may be received (506), e.g., in an Error Rate type test. In another implementation, multiple write pulses may be applied (504) followed by receipt of a single read signal (506), e.g., in an Endurance type test. In another implementation, a single write pulse may be applied (504) and multiple read signals may be received (506), e.g., in a Read Disturb type test. It should be understood that the enumerated tests are exemplary and that other types of tests may be performed if desired.

As illustrated, the process 500 includes a first measurement tier to determine if the read signal indicates a switching failure occurred (508). For example, the read signal is received by a comparator 124 shown in FIG. 1 or comparator(s) 236 shown in FIG. 2, which compares the read signal to a target level or predetermined threshold. An occurrence of a switching failure may be detected based on the comparison of the read signal to the target level. For example, in some tests, e.g., an Error Rate type test, the resistance state of the MRAM device is expected to switch after each write pulse, and thus, a failure event is indicated if the read signal does not indicate that the resistance state switched (or only partially switched). In other tests, such as the Read Disturb type test, the resistance state of the MRAM device is expected to remain constant, i.e., not switch, after each read voltage is applied, and thus, a failure event is indicated if the read signal indicates that the resistance state switched (or partially switched) due to a read voltage, or exceeded a margin higher or lower than the expected resistance state. In other tests, such as the Endurance type test, the resistance state of the MRAM device may be expected to switch or not switch, depending on the polarity of last write pulse applied to the MRAM device, and thus, a failure event may be indicated if the read signal does not indicate the proper resistance state, including a partial switch when either a complete switch is expected or no switch is expected, or exceeding a resistance margin higher or lower than the expected resistance state.

If the first tier measurement indicates a switching failure (508), a second tier measurement is performed (510). The second tier measurement is used to measure and store one or more switching performance parameters while the MRAM device is in a failure state. For example, in some implementations, switching performance parameters may be measured and recorded without pausing the test cycles, e.g., if an analog to digital converter is not used, or if the resistance measurement circuit is sufficiently fast that resistance may be measured without pausing the test cycles. By way of example, the resistance measurement circuit 126 in FIG. 1 or resistance measurement ADC 240 shown in FIG. 2 may be used to measure the resistance of the MRAM device when a failure event is detected. In other embodiments, multiple comparators may be used to provide an approximate measurement of the resistance of the MRAM device when a failure event is detected. In some implementations, for example, the second tier measurement may be performed (510) and the switching performance parameter measured and stored if a switching failure is detected by the first tier measurement (508). In other implementations, e.g., as illustrated by the dotted line 511, the second tier measurement may be performed (510), or at least initiated, in parallel with the first tier measurement (508), and the second tier measurement (510) is completed, e.g., the switching performance parameter is measured and stored by the second tier measurement, if the first measurement tier (508) detects a switching failure. Additionally, the cycle count may be determined and recorded, e.g., using the pulse/cycle counter 222 shown in FIG. 2. Additional switching performance parameters may include, e.g., the magnetic fields, write pulse(s) and read bias(es) characteristics. The switching performance parameters may be stored in on board or off board memory, such as memory 129 shown in FIG. 1.

After the switching performance parameters measured in the second tier measurement are recorded (510) or if the first tier measurement (508) does not detect a switching failure, the process determines whether all cycles have been completed (512). For example, as the test is a high repetition test, a large number of cycles, e.g., more than 10,000 or more than 100,000 cycles may be performed. If the test cycles are performed with high frequency, e.g., 10 kHz, a large number of cycles, e.g., 100,000, may be performed in a few seconds. The pulse control 212 shown in FIG. 2, for example, may determine whether all cycles have been performed.

If all cycles have not been completed, the process 500 cycles back to applying one or more write pulses (504). Optionally, as illustrated, one or more parameters of the write pulse(s), read voltages, or target levels in the comparators, or any combination thereof, may be adjusted (514) before performing the next operation. For example, the amplitude and/or pulse widths of the write pulse(s) may be adjusted, as well as the DC level of the read voltage(s). The target level(s) in one or more comparators 124 or 236 may be adjusted, thereby adjusting when a failure condition is determined to occur. Additionally, in some implementations, an external magnetic field, e.g., produced by the magnetic field generator 110 shown in FIG. 1, may be added or adjusted. The adjustment of the parameters of the write pulse and/or read voltage may be controlled, for example, by the controller 128 shown in FIG. 1 or the pulse control 212 shown in FIG. 2.

Once all cycles have been performed (512), the test may be ended (516).

Figure 5B:
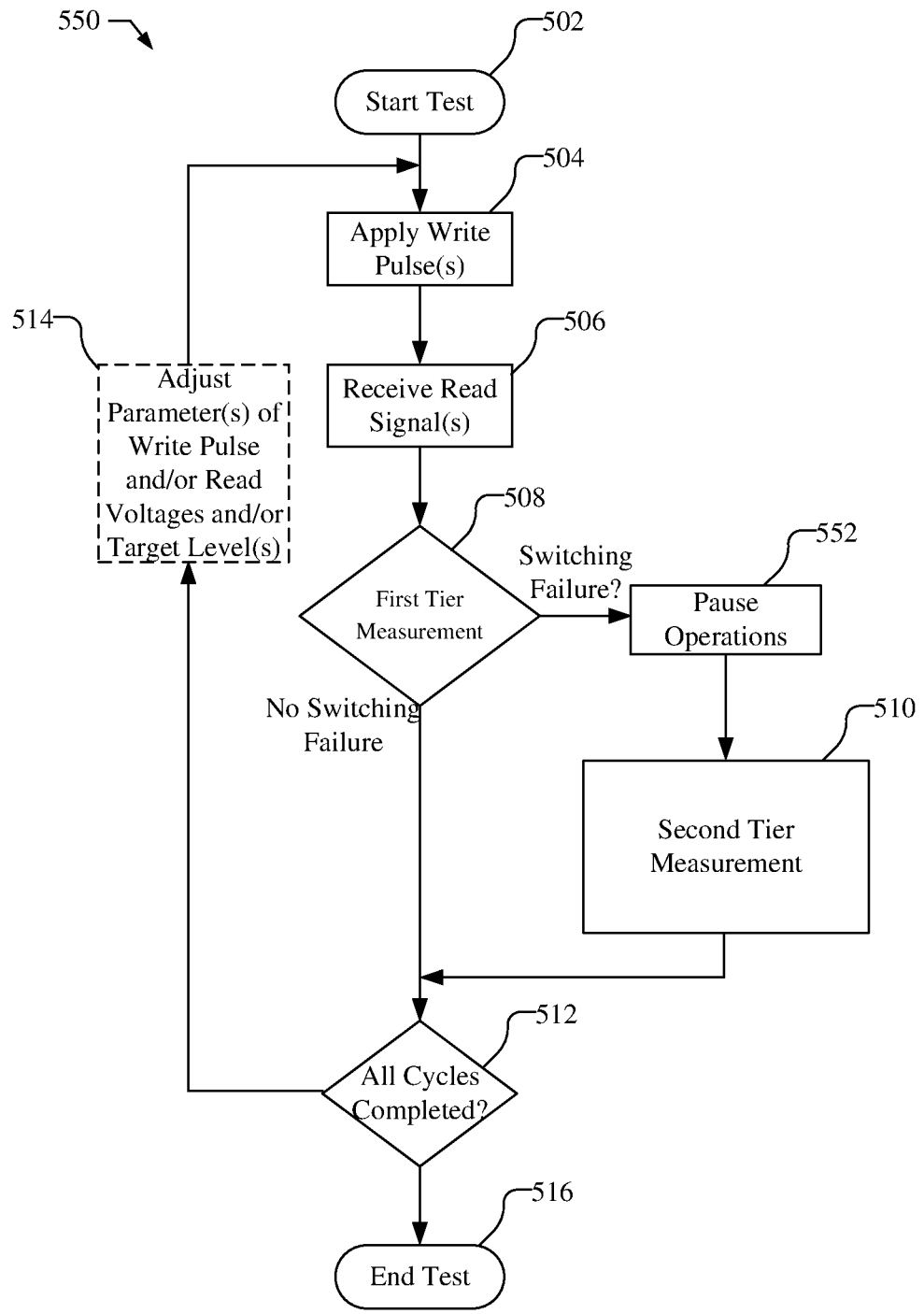

FIG. 5B shows a flow chart illustrating another process 550 of testing an MRAM device with a high repetition testing device, such as testing device 100 or switching detection circuits 200, or 300. The process 550 illustrated in FIG. 5B may be similar to process 500 shown in FIG. 5A, like designated elements being the same.

As illustrated in FIG. 5B, in process 550, if the first tier measurement (508) detects a switching failure, the operations are paused (552) while the MRAM device is further tested while it is in a failure state, e.g. by the second tier measurement (510) to measure one or more switching performance parameters. For example, in some implementations, it may be necessary to delay or pause the testing to provide enough time to measure and record the switching performance parameters for the second tier measurement (510), e.g., if the resistance measurement device used to measure and store the resistance value is too slow to operate within the frequency at which the test cycles are performed. The test stop/hold function 214, shown in FIG. 2, for example may be used to pause the testing while the switching performance parameters are measured and recorded.

While operations, e.g., a sequence of applying one or more write pulses (504) and receiving one or more read signals (506), are paused, the second tier measurements (552) may perform additional tests. For example, varying write pulses and/or read voltages and/or magnitude(s) of external magnetic fields may be applied to the MRAM device while in a failure state, and tests of the MRAM device are performed in the second tier measurements (510). The test of the MRAM device may include, for example, measuring the read signals from the MRAM device in response to the varying write pulses and/or read voltages and/or magnitude(s) of external magnetic fields. In another implementation, the test of the MRAM device may include determining when the MRAM device changes state in response to the varying write pulses and/or read voltages and/or magnitude(s) of external magnetic fields. The varying write pulses and/or read voltages, for example, may be produced by the write pulse generator 121 and read bias generator 122 in response to the controller 128 shown in FIG. 1 or pulse generator 232 in response to the pulse control 212 shown in FIG. 2, and is provided to the MRAM device, e.g., via the probe card 106 and varying magnitudes of external magnetic fields may be produced by the magnetic field generator 110. The read signal may be received via the current sense circuit 234 and may be received by, e.g., comparator 124 and resistance measurement circuit 126 in FIG. 1, and comparator(s) 236 and resistance measurement ADC 240 shown in FIG. 2. By way of example, if the MRAM device failed to switch resistance state, e.g., during an Error Rate type test or Endurance type test, write pulses with varying parameters, e.g., increasing amplitudes, increasing pulse widths, or a combination thereof, may be applied to the MRAM device, and the read signal measured, e.g., using the comparator 124 or 236 or the resistance measurement circuit 126 or resistance measurement ADC 240 to determine if MRAM device correctly switches in response to a write pulse. The comparators 124 or 236, for example, may be used to determine if the MRAM device switches in response to varying write pulses and/or read voltages and/or magnitude(s) of external magnetic fields. The parameters of the write pulse, for example, and associated measured resistance values of the read signals and/or the characteristic of the write pulse that caused the MRAM device to switch, may be recorded as the switching performance parameters by the second tier measurement (510). In other implementations, the read voltages may be varied and the measured resistance values of the read signals and associated read bias voltages, and/or magnitude of the applied read bias voltage that causes the MRAM device to change state may be recorded as the switching performance parameters by the second tier measurement (510). Additionally or alternatively, one or more magnitudes of the external magnetic field may be varied, and one or more of the measured resistance values of the read signals and associated magnitudes of the external magnetic field, and/or the magnitude of the external magnetic field that causes the MRAM device to change state may be recorded as the switching performance parameters by the second tier measurement (510). Additional or alternative tests on the MRAM device while it is in a failure state may be performed. For example, the resistance measurement of the MRAM device may be measured through a full sweep of the magnetic field to generate a MTJ Transfer Curve.

Figure 6:
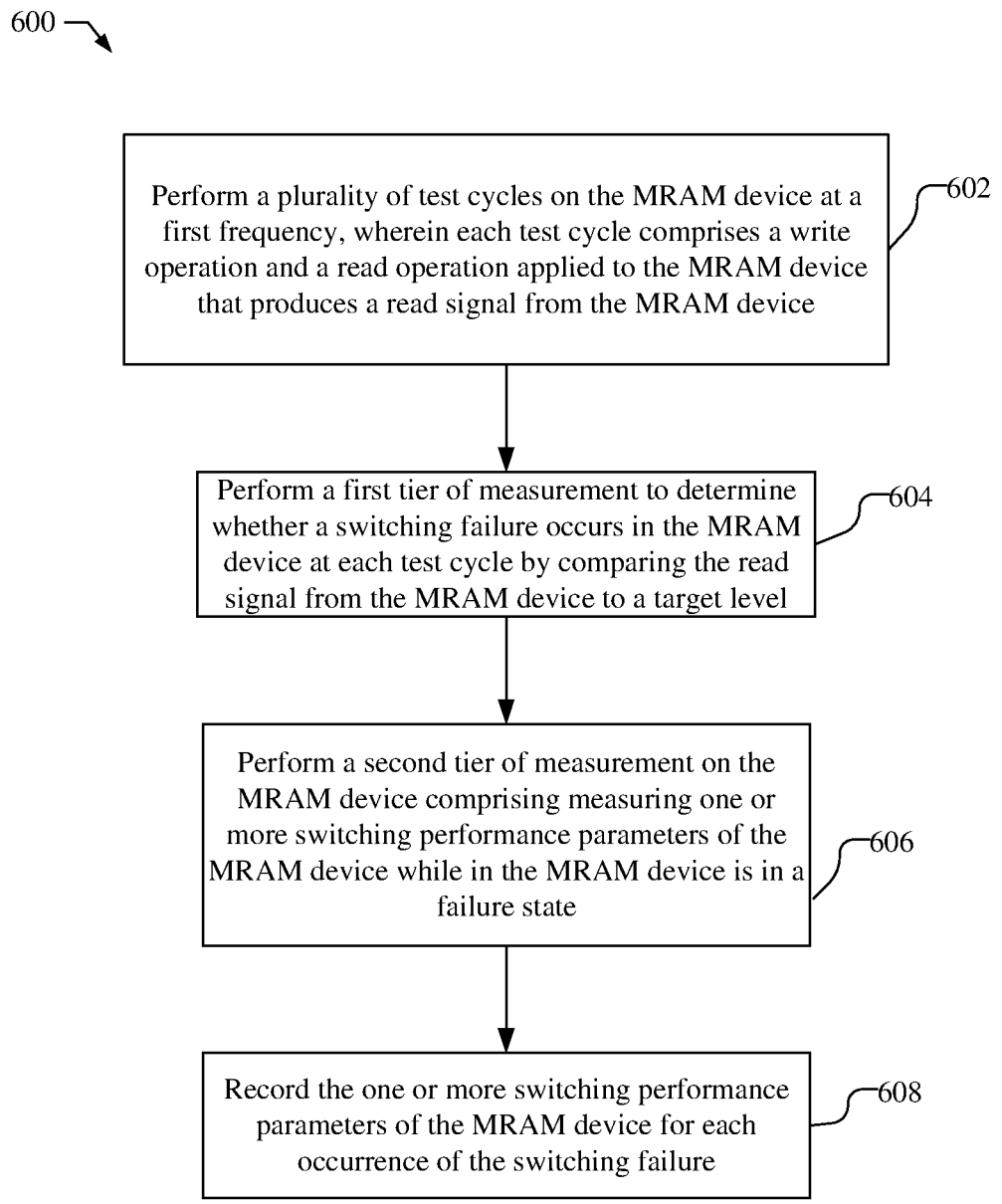
FIG. 6 is a flow chart illustrating a method of testing an MRAM device.

FIG. 6 is a flow chart illustrating a method 600 of testing a Magnetoresistive Random Access Memory (MRAM) device, e.g., for a low likelihood failure event. The MRAM device under test, for example, may be an MTJ device, an STT-MRAM device, an SOT MRAM, a Toggle MRAM, or other magnetic-based Random Access Memory device. The testing may be performed, e.g., with a tester, such as testing device 100 or switching detection circuits 200, 300, or 350.

At block 602, the method 600 includes performing a plurality of test cycles on the MRAM device at a first frequency, wherein each test cycle comprises a write operation and a read operation applied to the MRAM device that produces a read signal from the MRAM device, e.g., as discussed at stages 504, 506, and 512 in FIGS. 5A and 5BA and 5B. For example, the plurality of test cycles may be 10,000 or more test cycles. In each test cycle, the read operation may be performed in less than 10 μs after the write operation. The first frequency of the test cycles, for example, may be greater than 10 kHz. The write pulse generator 121, read bias generator 122, and controller 128 shown in FIG. 1 or the pulse generator 232, current sense circuit 234, and pulse control 212 shown in FIG. 2 may be the means for performing a plurality of test cycles on the MRAM device at a first frequency, wherein each test cycle comprises a write operation and a read operation applied to the MRAM device that produces a read signal from the MRAM device.

At block 604, a first tier of measurement is performed to determine whether a switching failure occurs in the MRAM device at each test cycle by comparing the read signal from the MRAM device to a target level, e.g., as discussed at stage 508 in FIGS. 5A and 5B. In one implementation, performing the first tier of measurement by comparing the read signal from the MRAM device to the target level does not measure a resistance value of the MRAM device. For example, in one implementation, performing the first tier of measurement by comparing the read signal from the MRAM device to the target level may include comparing one of a voltage value, a current value, or a resistance value to a corresponding one of a voltage target level, a current target level, or a resistance target level. In one implementation, comparing the read signal from the MRAM device to a target level comprises comparing the read signal from the MRAM device to multiple target levels. The comparator 124 shown in FIG. 1 or comparator(s) 236 shown in FIG. 2 may be the means for performing a first tier of measurement to determine whether a switching failure occurs in the MRAM device at each test cycle by comparing the read signal from the MRAM device to a target level.

At block 606, a second tier of measurement is performed on the MRAM device comprising measuring one or more switching performance parameters of the MRAM device while the MRAM device is in a failure state, e.g., as discussed at stage 510 in FIGS. 5A 5B. For example, in one implementation, a value of the read signal received from the MRAM device may be measured and recorded as a switching performance parameter. The measurement of the value of the read signal, for example, may be a current, a voltage, or a resistance. In one implementation, the test cycle numbers may be counted, wherein a test cycle number when the switching failure occurs is recorded as one of the one or more switching performance parameters, e.g., as discussed at stage 510 in FIG. 5A. The controller 128 in FIG. 1 or the pulse/cycle counter 222 in FIG. 2 may be a means for counting test cycle numbers, wherein a test cycle number when the switching failure occurs is recorded as one of the one or more switching performance parameters. In some implementations, the test cycles may be paused after the switching failure, wherein the second tier of measurement is performed before resuming the test cycles at the first frequency, e.g., as discussed at stage 552 of FIG. 5B. The resistance measurement circuit 126, write pulse generator 121, read bias generator 122, comparator 124, and the controller 128 in FIG. 1 or resistance measurement ADC 240, pulse generator 232, current sense circuit 234, comparator 236, and pulse control 212, and the test stop/hold function 214 in the pulse control 212 shown in FIG. 2 may be the means for performing a second tier of measurement on the MRAM device comprising measuring one or more switching performance parameters of the MRAM device while in the MRAM device is in a failure state. The test stop/hold function 214 in the pulse control 212 shown in FIG. 2 may be the means for pausing the test cycles after the switching failure, wherein the second tier of measurement is performed before resuming the test cycles at the first frequency.

At block 608, the one or more switching performance parameters of the MRAM device are recorded for each occurrence of the switching failure, e.g., as discussed at stage 510 in FIGS. 5A and 5B. The controller 128 and memory 129 in FIG. 1 or the record error function 220 in controller 210 in FIG. 2 may be the means for recording the one or more switching performance parameters of the MRAM device for each occurrence of the switching failure.

In one implementation, the write operation and the read operation applied to the MRAM device in each test cycle comprises applying a first write pulse having a first polarity and a first amplitude, applying a second write pulse having a second polarity that is opposite the first polarity and a second amplitude that is less than the first amplitude, and performing the read operation to produce a read signal from the MRAM device after the second write pulse, e.g., as discussed at stages 504 and 506 of FIGS. 5A and 5B. A switching failure, for example, may be determined when comparing the read signal from the MRAM device to the target level indicates the MRAM device failed to switch from the first polarity of the first write pulse to the second polarity of the second write pulse, e.g., as discussed at stage 508 of FIGS. 5A and 5B.

In one implementation, the write operation and the read operation applied to the MRAM device comprises applying a plurality of write pulses with alternating polarities and performing the read operation to produce a read signal from the MRAM device, e.g., as discussed at stages 504 and 506 of FIGS. 5A and 5B. In some implementations, the read operation may be performed after each write pulse. A switching failure, for example, may be determined when comparing the read signal from the MRAM device to the target level indicates the MRAM device failed to switch polarity, e.g., as discussed at stage 508 of FIGS. 5A and 5B.

In one implementation, the write operation and the read operation applied to the MRAM device comprises applying a write pulse and applying a plurality of read biases with different magnitudes, e.g., as discussed at stages 504 and 506 of FIGS. 5A and 5B. A the switching failure is determined when comparing the read signal from the MRAM device to the target level indicates the MRAM device switched, wherein the magnitude of the read bias when the switching failure occurs is recorded as one of the one or more switching performance parameters, e.g., as discussed at stage 508 of FIGS. 5A and 5B.

For example, in one implementation, the method 600 may include applying a plurality of read biases at varying magnitudes to the MRAM device while the MRAM device is in the switching failure state and testing the read signal from the MRAM device at each of the plurality of read biases, e.g., as discussed at stage 510 in FIG. 5B. For example, testing the read signal from the MRAM device comprises measuring values of the read signals at each of the plurality of read biases, and wherein one or more of the measured values of the read signals and associated one or more of the magnitudes of the read biases are recorded as one of the one or more switching performance parameters, e.g., as discussed at stage 510 of FIG. 5B. In another example, testing the read signal from the MRAM device comprises determining when the MRAM device changes state in response to an applied read bias and wherein a magnitude of the applied read bias that causes the MRAM device to change state is recorded as one of the one or more of the switching performance parameters, e.g., as discussed at stage 510 of FIG. 5B. For example, the write pulse generator 121, read bias generator 122, comparator 124, resistance measurement circuit 126, and controller 128, or the pulse generator 232, comparator(s) 236, resistance measurement ADC 240, and pulse control 212 shown in FIG. 2 may be the means for applying a plurality of read biases at varying magnitudes to the MRAM device while the MRAM device is in the switching failure state and testing the read signal from the MRAM device at each of the plurality of read biases.

In another example, the method 600 may include applying a plurality of write pulses with varying characteristics to the MRAM device while the MRAM device is in the switching failure state and testing the read signal from the MRAM device after applying each write pulse, e.g., as discussed at stage 510 of FIG. 5B. For example, testing the read signal from the MRAM device comprises measuring values of the read signals after applying each write pulse, and wherein one or more of the measured values of the read signals and the characteristics of associated write pulses are recorded as one of the one or more switching performance parameters, e.g., as discussed at stage 510 of FIG. 5B. In another example, testing the read signal from the MRAM device comprises determining when the MRAM device changes state in response to an applied write pulse, and wherein the characteristics of the write pulse at which the MRAM device changes state are recorded as one of the one or more switching performance parameters, e.g., as discussed at stage 510 of FIG. 5B. For example, whether a state of the MRAM device switches in response to one of the plurality of write pulses, and recording the characteristics of the write pulse at which the state of the MRAM device switches, e.g., as discussed in stage 510 of FIG. 5B. The varying characteristics of the plurality of write pulses comprises one or more of an amplitude and width. The write pulse generator 121, read bias generator 122, comparator 124, resistance measurement circuit 126, and controller 128, or the pulse generator 232, comparator(s) 236, resistance measurement ADC 240, and pulse control 212 shown in FIG. 2 may be the means for applying a plurality of write pulses with varying characteristics to the MRAM device while the MRAM device is in the switching failure state and testing the read signal from the MRAM device after applying each write pulse.

In another example, the method 600 may include applying one or more magnitudes of external magnetic field to the MRAM device while the MRAM device is in the switching failure state and testing the read signal from the MRAM device, e.g., as discussed at stage 510 of FIG. 5B. For example, testing the read signal from the MRAM device may include measuring values of the read signals at the one or more magnitudes of the external magnetic field, and wherein one or more of the measured values of the read signals and associated one or more magnitudes of the external magnetic field are recorded as switching performance parameters, e.g., as discussed at stage 510 of FIG. 5B. In another example, testing the read signal from the MRAM device may include determining when the MRAM device changes state in response the one or more magnitudes of the external magnetic field and a magnitude of the external magnetic field that causes the MRAM device to change state may be recorded as a switching performance parameter, e.g., as discussed at stage 510 of FIG. 5B. The magnetic field generator 110, comparator 124, resistance measurement circuit 126, and controller 128, or the pulse generator 232, comparator(s) 236, resistance measurement ADC 240, and pulse control 212 shown in FIG. 2 may be the means for applying one or more magnitudes of external magnetic field to the MRAM device while the MRAM device is in the switching failure state and testing the read signal from the MRAM device.

In one implementation, the target level may be adjusted during the testing of the MRAM device, wherein determining whether the switching failure occurs is performed at different target levels, e.g., as discussed at stage 514 of FIGS. 5A and 5B. For example, the comparator 124, and controller 128, in FIG. 1 or the comparator(s) 236 threshold DAC 238, and resistance error detector 218 shown in FIG. 2 may be a means for adjusting the target level during the testing of the MRAM device, wherein determining whether the switching failure occurs is performed at different target level.

In one specific example, the MRAM device under test may be an STT-MRAM, such as an MTJ device that, for example, has a high Resistance state of 5K ohms, and a low Resistance state of 1.5K ohms. Various tests may be applied to the MTJ device. For example, in one test A) applying a high enough positive (or negative) magnetic field will cause the MTJ device to toggle from low to high resistance (or high to low). This is generally referred to a Field Assist. A characterization of an MTJ device is to sweep the magnetic field while monitoring Resistance to determine the field magnitude that causes the device to toggle states, and also recording parameters such as offset between positive and negative field magnitudes (ex. +/−500 Oe). In another test, B) similarly, applying a suitably high positive (or negative) pulse with a certain pulse width and amplitude to the MTJ device that will also cause the device to toggle from low to high resistance (or high to low). This is generally referred to as Writing. A characterization of an MTJ device is to pulse with increasingly larger Voltages (keeping pulse width constant), or sweep with increasing wider pulse widths (keeping the voltage level constant), or a combination/matrix of the two, where after each pulse determine if the device switches states, in order to determine combinations of pulse width and voltages that will assure a write toggle operation. (ex. +/−600 mV, 10 nS pulse width). In another test, C), applying a combination of magnetic field plus pulsing is also possible, where for example a nominal assist field can be applied such that the device will switch with lower pulsing conditions (lower voltages and/or lower pulse widths). When measuring the Resistance, a suitably low bias may be applied, which is enough to be able to accurately measure the resistance but not high enough to cause a Write to occur (ex. 50 mV).

Considering the MRAM device may switch between high and low states under normal circumstances, a simple 50% threshold (halfway between 1.5 K ohms and 5 K ohms, meaning Low→3.25 Kohms→High) may be used as a determination of whether the device is in low or high state. This determination may be performed using an analog comparator where the threshold is pre-programmed at this 50% level, or digitally by comparing the resistance to a digital threshold. The methodology is the same in both cases, where a low read bias is applied and the resistance (or current, or voltage, or some other characteristic that is proportional to the device's resistance) is compared to a corresponding low high threshold. In a more complex system, there may be multiple thresholds to safeguard errors, such as <25% would be considered low, >75% would be high, but the range of resistances in between would be undefined and also considered an error. Similarly, one or more thresholds may be configured above or below the expected resistance state, such as 25% higher than the high resistance state, and this would also be considered an error. In any case, with this detection methodology, the MRAM device may be tested for proper resistance level or a switching failure. The use of an analog comparator may be desirable because an analog comparator responds very quickly and is suitable for high frequency repetitions.

While testing the MRAM device, a high-repetitive sequence of these Writes/Reads is performed in order to detect a switching failure. As switching failures may be rare, it is desirable to repeat the test sequences at a high frequency for many cycles, so that one or more of the rare failure events may be detected. With conventional testing equipment, the cycle frequency is limited making testing for switching failures commercially unviable. Once a switching failure is detected, the resistance and the cycle number at which the failure occurred may be recorded. An accurate resistance measurement generally takes more time than required to detect the switching failure, e.g., by an analog comparator, and accordingly, the test sequence may pause while the resistance is measured. Additionally, before restarting the remaining high-repetitive test sequence, the MRAM device may be tested while it is in the switching failure state with one or more or any combinations of tests, such as tests A, B, or C, discussed above, which are more time-consuming than either the switching failure detection or the resistance measurement. The various tests of the MRAM device that may be used while the test sequence is paused and the MRAM device is in a switching failed state, enables characterization of the MRAM device to determine if the MRAM device behaves differently from these same characterizations when the MRAM device is behaving normally, e.g., based on the same tests on the MRAM device when it is not in a switching failed state.

Reference throughout this specification to "one example", "an example", "certain examples", or "exemplary implementation" means that a particular feature, structure, or characteristic described in connection with the feature and/or example may be included in at least one feature and/or example of claimed subject matter. Thus, the appearances of the phrase "in one example", "an example", "in certain examples" or "in certain implementations" or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of testing a Magnetoresistive Random Access Memory (MRAM) device, the method comprising:
    performing a plurality of test cycles on the MRAM device at a first frequency, wherein each test cycle comprises a write operation and a read operation applied to the MRAM device that produces a read signal from the MRAM device;
    performing a first tier of measurement to determine whether a switching failure occurs in the MRAM device at each test cycle by comparing the read signal from the MRAM device to a target level;
    performing a second tier of measurement on the MRAM device comprising measuring one or more switching performance parameters of the MRAM device while the MRAM device is in a failure state; and
    recording the one or more switching performance parameters of the MRAM device for one or more switching failures.

2. The method of claim 1, wherein the plurality of test cycles comprises 10,000 or more test cycles.

3. The method of claim 2, wherein in each test cycle the read operation is performed in less than 10 μs after the write operation.

4. The method of claim 2, wherein the first frequency is greater than 10 kHz.

5. The method of claim 1, performing the first tier of measurement by comparing the read signal from the MRAM device to the target level does not measure a resistance value of the MRAM device.

6. The method of claim 1, performing the first tier of measurement by comparing the read signal from the MRAM device to the target level comprises comparing one of a voltage value, a current value, or a resistance value to a corresponding one of a voltage target level, a current target level, or a resistance target level.

7. The method of claim 1, wherein performing the second tier of measurement by measuring the one or more switching performance parameters of the MRAM device comprises measuring a value of the read signal received from the MRAM device, and wherein the value is recorded as a switching performance parameter.

8. The method of claim 7, wherein the measurement of the value of the read signal comprises a voltage, a current, or a resistance.

9. The method of claim 1, further comprising pausing the test cycles after the switching failure, wherein the second tier of measurement is performed before resuming the test cycles at the first frequency.

10. The method of claim 1, further comprising counting test cycle numbers, wherein a test cycle number when the switching failure occurs is recorded as one of the one or more switching performance parameters.

11. The method of claim 1, wherein the write operation in each test cycle comprises applying a plurality of write pulses to the MRAM device with one or more amplitudes and one or more widths.

12. The method of claim 1, wherein the read operation in each test cycle comprises applying a read bias to the MRAM device, wherein the read bias comprises a bias voltage or bias current.

13. The method of claim 1, wherein the write operation and the read operation applied to the MRAM device in each test cycle comprises applying a first write pulse having a first polarity and a first amplitude, applying a second write pulse having a second polarity that is opposite the first polarity and a second amplitude that is less than the first amplitude, and performing the read operation to produce the read signal from the MRAM device after the second write pulse.

14. The method of claim 13, wherein the switching failure is determined when comparing the read signal from the MRAM device to the target level indicates the MRAM device failed to switch from the first polarity of the first write pulse to the second polarity of the second write pulse.

15. The method of claim 1, wherein the write operation and the read operation applied to the MRAM device comprises applying a plurality of write pulses with alternating polarities and performing the read operation to produce the read signal from the MRAM device.

16. The method of claim 15, wherein the switching failure is determined when comparing the read signal from the MRAM device to the target level indicates the MRAM device failed to switch polarity.

17. The method of claim 1, wherein the write operation and the read operation applied to the MRAM device comprises applying a write pulse and applying a plurality of read biases with different magnitudes.

18. The method of claim 17, wherein the switching failure is determined when comparing the read signal from the MRAM device to the target level indicates the MRAM device switched, wherein a magnitude of the read bias when the switching failure occurs is recorded as one of the one or more switching performance parameters.

19. The method of claim 1, wherein measuring the one or more switching performance parameters of the MRAM device in the second tier of measurement after pausing the test cycles comprises:
    applying a plurality of read biases at varying magnitudes to the MRAM device while the MRAM device is in the switching failure state and testing the read signal from the MRAM device at each of the plurality of read biases.

20. The method of claim 19, wherein testing the read signal from the MRAM device comprises measuring values of the read signals at each of the plurality of read biases, and wherein one or more of the measured values of the read signals and associated one or more of the magnitudes of the read biases are recorded as one of the one or more switching performance parameters.

21. The method of claim 19, wherein testing the read signal from the MRAM device comprises determining when the MRAM device changes state in response to an applied read bias and wherein a magnitude of the applied read bias that causes the MRAM device to change state is recorded as one of the one or more of the switching performance parameters.

22. The method of claim 1, wherein measuring the one or more switching performance parameters of the MRAM device in the second tier of measurement after pausing the test cycles comprises:
applying a plurality of write pulses with varying characteristics to the MRAM device while the MRAM device is in the switching failure state and testing the read signal from the MRAM device after applying each write pulse.

23. The method of claim 22, wherein testing the read signal from the MRAM device comprises measuring values of the read signals after applying each write pulse, and wherein one or more of the measured values of the read signals and the characteristics of associated write pulses are recorded as one of the one or more switching performance parameters.

24. The method of claim 22, wherein testing the read signal from the MRAM device comprises determining when the MRAM device changes state in response to an applied write pulse, and wherein the characteristics of the write pulse at which the MRAM device changes state are recorded as one of the one or more switching performance parameters.

25. The method of claim 22, wherein the varying characteristics of the plurality of write pulses comprises one or more of an amplitude and width.

26. The method of claim 1, wherein measuring the one or more switching performance parameters of the MRAM device in the second tier of measurement after pausing the test cycles comprises:
applying one or more magnitudes of external magnetic field to the MRAM device while the MRAM device is in the switching failure state and testing the read signal from the MRAM device.

27. The method of claim 26, wherein testing the read signal from the MRAM device comprises measuring values of the read signals at the one or more magnitudes of the external magnetic field, and wherein one or more of the measured values of the read signals and associated one or more magnitudes of the external magnetic field are recorded as one of the one or more switching performance parameters.

28. The method of claim 26, wherein testing the read signal from the MRAM device comprises determining when the MRAM device changes state in response to the one or more magnitudes of the external magnetic field and wherein a magnitude of the external magnetic field that causes the MRAM device to change state is recorded as one of the one or more switching performance parameters.

29. The method of claim 1, further comprising adjusting the target level during the testing of the MRAM device, wherein determining whether the switching failure occurs is performed at different target levels.

30. The method of claim 1, wherein comparing the read signal from the MRAM device to the target level comprises comparing the read signal from the MRAM device to multiple target levels.

31. An apparatus for testing a Magnetoresistive Random Access Memory (MRAM) device, the apparatus comprising:
a probe array configured to be coupled to the MRAM device to provide a write pulse and a read bias and receive a read signal;
one or more measurement circuits that provide measurements of the read signal;
at least one memory; and
at least one processor coupled to the probe array, the one or more measurement circuits, and the at least one memory, the at least one processor being configured to:
perform a plurality of test cycles on the MRAM device at a first frequency, wherein each test cycle comprises a write operation and a read operation applied to the MRAM device that produces the read signal from the MRAM device;
perform a first tier of measurement on the MRAM device with the one or more measurement circuits to determine whether a switching failure occurs in the MRAM device at each test cycle by comparing the read signal from the MRAM device to a target level;
perform a second tier of measurement on the MRAM device with the one or more measurement circuits to measure one or more switching performance parameters of the MRAM device while in the MRAM device is in a failure state; and
record the one or more switching performance parameters of the MRAM device for one or more switching failures.

32. The apparatus of claim 31, wherein the one or more measurement circuits used for the first tier of measurement comprises at least one of a comparator and an analog to digital converter or a combination thereof.

33. The apparatus of claim 31, wherein the plurality of test cycles comprises 10,000 or more test cycles.

34. The apparatus of claim 33, wherein in each test cycle the read operation is performed in less than 10 μs after the write operation.

35. The apparatus of claim 33, wherein the first frequency is greater than 10 kHz.

36. The apparatus of claim 31, wherein comparing the read signal from the MRAM device to the target level during the first tier of measurement does not measure a resistance value of the MRAM device.

37. The apparatus of claim 31, wherein comparing the read signal from the MRAM device to the target level during the first tier of measurement comprises comparing one of a voltage value, a current value, or a resistance value to a corresponding one of a voltage target level, a current target level, or a resistance target level.

38. The apparatus of claim 31, wherein the one or more measurement circuits used for the second tier of measurement comprises an analog to digital converter, wherein the at least one processor is configured to perform the second tier of measurement by causing the analog to digital converter to receive a measured value of the read signal to record the value as a switching performance parameter.

39. The apparatus of claim 38, wherein the value comprises a voltage, a current, or a resistance.

40. The apparatus of claim 31, wherein the at least one processor is further configured to pause the test cycle after the switching failure occurs and perform the second tier of measurement before resuming the test cycles at the first frequency.

41. The apparatus of claim 31, wherein the at least one processor is further configured to count test cycle numbers, wherein a test cycle number when the switching failure occurs is recorded as one of the one or more switching performance parameters.

42. The apparatus of claim 31, wherein the write operation in each test cycle comprises applying a plurality of write pulses to the MRAM device with one or more amplitudes and one or more widths.

43. The apparatus of claim 31, wherein the read operation in each test cycle comprises applying a read bias to the MRAM device, wherein the read bias comprises a bias voltage or bias current.

44. The apparatus of claim 31, wherein the write operation and the read operation applied to the MRAM device in each test cycle comprises applying a first write pulse having a first polarity and a first amplitude, applying a second write pulse having a second polarity that is opposite the first polarity and a second amplitude that is less than the first amplitude, and performing the read operation to produce the read signal from the MRAM device after the second write pulse.

45. The apparatus of claim 44, wherein the switching failure is determined when a comparison between the read signal and the target level indicates the MRAM device failed to switch from the first polarity of the first write pulse to the second polarity of the second write pulse.

46. The apparatus of claim 31, wherein the write operation and the read operation applied to the MRAM device comprises applying a plurality of write pulses with alternating polarities and performing the read operation to produce the read signal from the MRAM device.

47. The apparatus of claim 46, wherein the switching failure is determined when a comparison between the read signal and the target level indicates the MRAM device failed to switch polarity.

48. The apparatus of claim 31, wherein the write operation and the read operation applied to the MRAM device comprises applying a write pulse and applying a plurality of read biases with different magnitudes.

49. The apparatus of claim 48, wherein the switching failure is determined when comparing the read signal from the MRAM device to the target level indicates the MRAM device switched, wherein a magnitude of the read bias when the switching failure occurs is recorded as one of the one or more switching performance parameters.

50. The apparatus of claim 31, wherein the at least one processor is configured to measure the one or more switching performance parameters of the MRAM device in the second tier of measurement after pausing the test cycles by being configured to:
apply a plurality of read biases at varying magnitudes to the MRAM device while the MRAM device is in the switching failure state and testing the read signal from the MRAM device at each of the plurality of read biases.

51. The apparatus of claim 50, wherein the at least one processor is configured to test the read signal from the MRAM device by being configured to measure values of the read signals at each of the plurality of read biases, and wherein one or more of the measured values of the read signals and associated one or more of the magnitudes of the read biases are recorded as one of the one or more switching performance parameters.

52. The apparatus of claim 50, wherein the at least one processor is configured to test the read signal from the MRAM device by being configured to determine when the MRAM device changes state in response to an applied read bias and wherein a magnitude of the applied read bias that causes the MRAM device to change state is recorded as one of the one or more of the switching performance parameters.

53. The apparatus of claim 31, wherein the at least one processor is configured to measure the one or more switching performance parameters of the MRAM device in the second tier of measurement after pausing the test cycles by being configured to:
apply a plurality of write pulses with varying characteristics to the MRAM device while the MRAM device is in the switching failure state and testing the read signal from the MRAM device after applying each write pulse.

54. The apparatus of claim 53, wherein the at least one processor is configured to test the read signal from the MRAM device by being configured to measure values of the read signals after applying each write pulse, and wherein one or more of the measured values of the read signals and the characteristics of associated write pulses are recorded as one of the one or more switching performance parameters.

55. The apparatus of claim 53, wherein the at least one processor is configured to test the read signal from the MRAM device by being configured to determine when the MRAM device changes state in response to an applied write pulse, and wherein the characteristics of the write pulse at which the MRAM device changes state are recorded as one of the one or more switching performance parameters.

56. The apparatus of claim 53, wherein the varying characteristics of the plurality of write pulses comprises one or more of an amplitude and width.

57. The apparatus of claim 31, further comprising:
a magnetic field generator that generates an external magnetic field to the MRAM device;
wherein the at least one processor is configured to measure the one or more switching performance parameters of the MRAM device in the second tier of measurement after pausing the test cycles by being configured to:
apply one or more magnitudes of the external magnetic field to the MRAM device while the MRAM device is in the switching failure state and test the read signal from the MRAM device.

58. The apparatus of claim 57, wherein the at least one processor is configured to test the read signal from the MRAM device by being configured to measure values of the read signals at the one or more magnitudes of the external magnetic field, and wherein one or more of the measured values of the read signals and associated one or more magnitudes of the external magnetic field are recorded as one of the one or more switching performance parameters.

59. The apparatus of claim 57, wherein the at least one processor is configured to test the read signal from the MRAM device by being configured to determine when the MRAM device changes state in response to the one or more magnitudes of the external magnetic field and wherein a magnitude of the external magnetic field that causes the MRAM device to change state is recorded as one of the one or more switching performance parameters.

60. The apparatus of claim 31, wherein the at least one processor is further configured to adjust the target level during the testing of the MRAM device, wherein the at least one processor is configured to determine whether the switching failure occurs is performed at different target levels.

61. The apparatus of claim 31, wherein the at least one processor is configured to compare the read signal from the MRAM device to different target levels.

62. An apparatus of testing a Magnetoresistive Random Access Memory (MRAM) device, comprising:
- means for performing a plurality of test cycles on the MRAM device at a first frequency, wherein each test cycle comprises a write operation and a read operation applied to the MRAM device that produces a read signal from the MRAM device;
- means for performing a first tier of measurement to determine whether a switching failure occurs in the MRAM device at each test cycle by comparing the read signal from the MRAM device to a target level;
- means for pausing the test cycles after the switching failure occurs and performing a second tier of measurement on the MRAM device before resuming the test cycles at the first frequency, the second tier of measurement comprising measuring one or more switching performance parameters of the MRAM device while in the MRAM device is in a failure state; and
- means for recording the one or more switching performance parameters of the MRAM device for each occurrence of the switching failure.

* * * * *